(12) United States Patent
Frank et al.

(10) Patent No.: US 12,390,987 B2
(45) Date of Patent: Aug. 19, 2025

(54) HYBRID RESIN COMPOSITION FOR THE 3D-PRINTING OF OBJECTS

(71) Applicant: CUBICURE GMBH, Vienna (AT)

(72) Inventors: Christian Frank, Vienna (AT); Christian Gorsche, Vienna (AT)

(73) Assignee: CUBICURE GMBH, Vienna (AT)

( * ) Notice: Subject to any disclaimer, the term of this patent is extended or adjusted under 35 U.S.C. 154(b) by 74 days.

(21) Appl. No.: 18/279,083

(22) PCT Filed: Feb. 24, 2022

(86) PCT No.: PCT/IB2022/051638
§ 371 (c)(1),
(2) Date: Aug. 28, 2023

(87) PCT Pub. No.: WO2022/180566
PCT Pub. Date: Sep. 1, 2022

(65) Prior Publication Data
US 2024/0198582 A1 Jun. 20, 2024

(30) Foreign Application Priority Data
Feb. 26, 2021 (EP) ..................................... 21020110

(51) Int. Cl.
*B33Y 70/00* (2020.01)
*B29C 64/124* (2017.01)
(Continued)

(52) U.S. Cl.
CPC .......... *B29C 64/129* (2017.08); *B29C 64/124* (2017.08); *B29C 64/264* (2017.08);
(Continued)

(58) Field of Classification Search
CPC ............................... B33Y 70/00; B33Y 70/10
See application file for complete search history.

(56) References Cited

U.S. PATENT DOCUMENTS 5,063,269 A 11/1991 Hung
2016/0160077 A1* 6/2016 Rolland ............. C08G 18/4825
521/134

(Continued)

FOREIGN PATENT DOCUMENTS

| JP | 2016160372 A | 9/2016 |
|---|---|---|
| WO | 2017112521 A1 | 6/2017 |
| WO | 2021021971 A1 | 2/2021 |

OTHER PUBLICATIONS

International Search Report and Written Opinion received in PCT/IB2022/051638 dated Apr. 7, 2022, pp. 12.
(Continued)

*Primary Examiner* — Atul P. Khare
(74) *Attorney, Agent, or Firm* — Liang & Hennessey LLP; Brian Hennessey

(57) ABSTRACT

A hybrid resin composition for the 3D-printing of objects, including at least one monofunctional, light-curable component A functioning as a reactive diluent (RD), at least one mono- or multifunctional, light-curable component B functioning as a toughness modifier (TNM), and at least one mono- or multifunctional, heat curable component C functioning as a $T_g$-enhancer (TGE).

29 Claims, 15 Drawing Sheets

(51) Int. Cl.
  *B29C 64/129*   (2017.01)
  *B29C 64/264*   (2017.01)
  *B29C 64/295*   (2017.01)
  *B33Y 10/00*    (2015.01)
  *B33Y 80/00*    (2015.01)
  *C08F 2/50*     (2006.01)
  *C08F 222/10*   (2006.01)
  *B29K 233/04*   (2006.01)
  *B33Y 30/00*    (2015.01)

(52) U.S. Cl.
  CPC ............ *B29C 64/295* (2017.08); *B33Y 10/00* (2014.12); *B33Y 70/00* (2014.12); *B33Y 80/00* (2014.12); *C08F 2/50* (2013.01); *C08F 222/1065* (2020.02); *B29K 2233/04* (2013.01)

(56) References Cited

U.S. PATENT DOCUMENTS

2019/0249018 A1* 8/2019 Steeman ............. C08F 290/061
2020/0157258 A1   5/2020 Saitoh et al.
2020/0282636 A1   9/2020 Nishimoto et al.

OTHER PUBLICATIONS

International Preliminary Report received in PCT/IB2022/051638 dated Feb. 20, 2023, pp. 23.

\* cited by examiner (grey area indicates the time until an output energy density comparable to the 3D-printing process is reached, light irradiation starts at 30 s)

(CE1 solid, E1 dash, CE3 dot)

(Strength - no fill, modulus - solid fill, thermal performance measured by $T_g$ – striped fill, toughness measured by elongation at break – grid fill)

(CE2 solid, E2 dash, E3 dash dot, CE3 dot)

(Strength - no fill, modulus - solid fill, thermal performance measured by $T_g$ – striped fill, toughness measured by elongation at break – grid fill)

(CE4 solid, E4 dash)

(CE5 dot, E5 dash dot)

(CE6.1 solid, E6.1 dash, CE6.3 dot)

(Strength - no fill, modulus - solid fill, thermal performance measured by $T_g$ – striped fill, toughness measured by elongation at break – grid fill)

(CE6.2 solid, E6.2 dash, E6.3 dash dot, CE6.3 dot)

(Strength - no fill, modulus - solid fill, thermal performance measured by $T_g$ – striped fill, toughness measured by elongation at break – grid fill)

(Strength - no fill, modulus - solid fill, thermal performance measured by $T_g$ – striped fill, toughness measured by elongation at break – grid fill)

HYBRID RESIN COMPOSITION FOR THE 3D-PRINTING OF OBJECTS

CROSS-REFERENCE TO RELATED APPLICATIONS

The present application is a national phase application of PCT Application No. PCT/IB2022/051638, filed Feb. 24, 2022, entitled "HYBRID RESIN COMPOSITION FOR THE 3D-PRINTING OF OBJECTS", which claims the benefit of European Patent Application No. 21020110.9, filed Feb. 26, 2021, each of which is incorporated by reference in its entirety.

BACKGROUND OF THE INVENTION

1. Field of the Invention

The invention relates to a hybrid resin composition for the 3D-printing of objects having improved toughness and improved thermal properties. Further, the invention relates to a method of manufacturing an object by 3D-printing from the inventive hybrid resin composition and to an object manufactured from the inventive resin composition.

2. Description of the Related Art

Lithography-based additive manufacturing technologies (L-AMTs) are progressing out of a sole prototyping segment toward industrial relevance for part production. Numerous novel process solutions (e.g., Hot Lithography—EP 3284583 A1, CLIP—US 2015/0072293 A1, HARP—WO 2020/185692 A2) are driving the field in terms of material freedom and production capacity (e.g., via increased speed or increased material throughput) and such innovations are accompanied by a vast range of new material technologies (e.g., UV-curable elastomers—DOI: 10.1002/adma.201606000, tough photopolymers—EP 3090722 A1, high-temperature-resistant materials—EP 3632941 A1) to realize final applications in critical fields such as the medical sector (e.g., dental, orthodontics, tissue engineering, regenerative medicine), the mobility sector (e.g., aerospace, railway, automotive), the electronics market, the consumer goods sector (e.g., sports sector, jewelry, cosmetics, personal care products) that can profit from the potentials of additive manufacturing (e.g., design freedom, production flexibility).

Light-curable materials (resins or formulations) for L-AMTs are typically composed of reactive components (e.g., monomers, oligomers and photoinitiators) that polymerize and cure upon light irradiation and certain additives that further adjust the overall material performance. Typically, the photoinitiator is activated via light irradiation and generates a reactive site (e.g., a radical, cation or anion) that can then react with the respective reactive components (e.g., (meth)acrylates, (meth)acrylamides, vinyl esters, vinyl ethers, vinyl amides, N-vinyl compounds, vinyl carbonates, vinyl carbamates, maleimides, itaconates, fumarates, styrene compounds, cyclic ethers such as epoxy compounds or oxetanes, benzoxazines, oxazolines, cyanoacrylates) to form a cured material.

Processing of such light-curable formulations into 3D-parts can be performed via various L-AMTs with non-limiting examples being stereolithography (SLA), digital light processing (DLP), digital inkjet printing, Hot Lithography, continuous liquid interface production (CLIP), high-area rapid printing (HARP), multijet modeling, two photon photopolymerization (TPP) or other liquid additive manufacturing technologies. The mentioned technologies are mostly based on a layer-by-layer build-up of the final 3D-part and can be realized in various forms such as bottom-up or top-down, in a continuous fashion, and/or by using moving-DLP or laser-type systems for larger printing areas. Current resin formulations applied for such technologies are almost exclusively of low viscosity (<5 Pa s), which is imperative for a successful build-up job or build-up step and ensures high feature resolution and prevents processing defects.

Applicant has developed the Hot Lithography Process (EP 3284583 A1), which allows for lithography-based 3D-structuring at elevated temperatures of light-curable resins having high viscosities of typically >5 Pa s at ambient temperature (20° ° C.). In the context of EP 3284583 A1, high viscosities are to be found when processing light-curable resins having high contents of monomers, oligomers and/or prepolymers with high molecular weight (number average molecular weight>500 g mol$^{-1}$, preferably >2000 g mol$^{-1}$) and/or high melting or softening temperatures (>35° C.) and/or strong intermolecular forces (e.g., urethanes, ureas, carbonates, esters, amides) and/or high contents of filling materials (e.g., ceramic, metal and/or polymer particles and/or fibers) that are added to the light-curable resins in order to optimize final material performance. The combination of high temperatures and processing of highly viscous formulations enables the 3D-structuring of light-curable materials with combined toughness, heat resistance and impact resistance.

Resin compositions for lithography-based 3D-structuring to form photopolymer materials that exhibit improved heat resistance (e.g., increased $T_g$), while not sacrificing toughness (e.g., maintained elongation at break), or vice versa, are of critical interest for the whole radiation curing industry with non-limiting examples being thin-layer applications such as coatings, adhesives, sandwich constructions or applications from bulk processing technologies such as material extrusion, resin infusion, resin transfer molding, L-AMTs). Numerous material concepts have been outlined in literature, typically sacrificing heat resistance for improved toughness.

i) For instance, gaining control over the network forming mechanism through regulation of the radical or cationic curing mechanism via thiol-ene photopolymerization or by using addition fragmentation chain transfer reactions (e.g., vinyl sulfones in radical chemistry or alcohols in cationic polymerizations) yields photopolymer networks with lower crosslinking density, thus higher toughness is achieved by critically compromising $T_g$.

ii) Another approach to achieving tough photopolymers is the use of light-curable, high molecular weight oligomers, preferably with a $T_g$ below ambient conditions, so the introduction of long flexible linkers yields final photopolymer network toughness. Herein, when higher amounts of monofunctional reactive diluents are employed in place of crosslinking monomers within the resin formulation to enable processing of such high molecular weight oligomers, toughness is critically improved, yet heat resistance and strength are often compromised (DOI: 10.1002/adma.201606000).

iii) In another way, such light-curable oligomeric compounds having higher molecular weights could also be employed when preferably exhibiting a $T_g$ above ambient conditions, which would critically improve printing performance and alter the material performance of the final photopolymer. While (thermo)mechanical performance such as $T_g$, modulus and strength would be enhanced, toughness is simultaneously compromised (US 2019/0249018 A1 and WO 2019/204807 A1).

Recently, a strong focus has been put on hybrid resin systems composed of one or more additional material concepts different from the photopolymer network formation used in the light-structuring step of L-AMTs. Such promising hybrid material concepts show great potential for the formation of tough photopolymer resins for additive manufacturing and could yield photopolymerized materials with simultaneously high toughness and heat resistance. Hybrid resin systems can be defined as resin materials that exhibit various curing steps triggered by different impulses (e.g., a light-curing step followed by a subsequent heat-curing step—US 2016/0160077 A1) and/or materials that exhibit multiple hardening mechanisms (e.g., combined radical and cationic curing mechanisms or various radical curing mechanisms—WO 2016/200972 A1; WO 2018/191247 A1). Such formed photopolymer networks are considered hybrid materials composed of a first component and a second or multiple further components and typically represent a full interpenetrating network (IPN), a semi-IPN, a pseudo-IPN, a dual network or a polymer blend. In order to maintain reactivity toward light, thus ensure processability in L-AMTs, formulations with an effective content of light-curable components need to be formulated to yield materials with sufficient green strength. Green strength is the mechanical strength of a respective material (e.g., measured by tensile or bending test) received after the light-curing additive manufacturing step.

Materials formed from such hybrid resins via different curing mechanisms through a first light-curing step and a second or multiple further curing steps different from said first light-curing step, offer a powerful design strategy for performance photopolymers with simultaneously high toughness and heat resistance. Said second or multiple further curing steps can be performed either simultaneously or subsequently to the first light-curing step (e.g., structuring step in L-AMTs) and examples of said second or multiple further curing steps are:

i) heat-curing steps triggering the thermal curing of the resin parts that have not been cured via the first light-curing step (e.g., thermal curing of an epoxy thermoset within an acrylate matrix), ii) curing steps catalyzed by moisture or organic catalysts triggering the curing of the resin parts that have not been cured via the first light-curing step (e.g., curing of resins with free isocyanate- or silane-groups) and/or curing steps that first trigger the decomposition of resin moieties, which then subsequently trigger the curing of the resin parts that have not been cured via the first light-curing step (e.g., curing and/or deblocking of resins with blocked isocyanate-groups), iii) light-curing steps triggering a different curing mechanism than in the first light-curing step to initiate curing of the resin parts that have not been cured via the first light-curing step (e.g., acrylate/epoxy resin systems cured via radical and cationic photopolymerization), iv) light-curing steps triggered by a different wavelength from the first light-curing step to initiate curing of the resin parts that have not been cured via the first light-curing step (e.g., acrylate resin part cured at wavelengths>390 nm and epoxy resin part cured at wavelengths<380 nm).

Limited examples of such hybrid resins have been introduced to light-curable formulations for 3D-printing, as such hybrid resins are often designed for easy application and fast curing (e.g., 2-K systems that already cure at ambient conditions such as room temperature and/or moisture), thus are not ideal for more complex part production processes such as L-AMTs, which critically require high process stability through stable raw material formulations, preferably 1K-systems, homogeneous and controlled resin curing in defined production steps and controlled post-curing. While such hybrid material systems significantly gain material performance via a second or multiple further curing steps triggering the curing of the resin part that has not been cured via the first light-curing step, it needs to be ensured that the curing steps different from the light-curing step are not spontaneously triggered or slowly taking place outside the area of irradiation (light-curing) during the production process, especially in application fields such as L-AMTs, where short resin stabilities, inhomogeneous and/or uncontrolled curing and/or uncontrolled material gradients are typically not desired.

As is the case for hybrid resins composed of radical and cationic curable components (e.g., acrylate/epoxy-systems) the cationic ring-opening mechanism for the curing of epoxy-based components is comparatively slow and requires a higher energy dose of actinic radiation to support additive manufacturing. In a further aspect such acrylate/epoxy resins exhibit poor liquid stability originating from the living nature of the cationic polymerization mechanism. This living nature further results in challenges of part precision and resolution during the 3D-printing process. Moreover, such resin systems critically lack biocompatibility having to use cationic photoinitiators composed of antimony salts and resulting polymer parts suffer from yellowing issues over long-term exposure to UV-light.

SUMMARY OF THE INVENTION

It is thus the object of the present invention to provide a hybrid resin composition that is adapted to be used in L-AMTs, which allows for 3D-printing of photopolymer materials and products with improved thermal resistance (e.g., higher glass transition temperature $T_g$ or heat deflection temperature HDT, reduced temperature-dependent modulus drop) and at the same time maintaining toughness (e.g., indicated by retention of elongation at break via tensile testing), or vice versa.

In order to solve this objective, a hybrid resin composition for the 3D-printing of objects is provided comprising polymerizable components A, B and C (and optionally D). The resin composition is comprising:

component A being at least one monofunctional, light-curable component having the formula (I), also referred to as reactive diluent (RD), comprising a reactive species Y that is susceptible of radical or cationic polymerization and a side group X, said component A upon light-induced curing forming a polymer backbone, said backbone preferably having a $T_g$>25° C., $$X-Y \qquad \text{Formula (I)}$$

component B being at least one mono- or multifunctional, light-curable component, which copolymerizes with component A via a corresponding curing mechanism, having a molecular weight of >500 g mol$^{-1}$, serving as a toughness-modifier (TNM), preferably forming a polymerized network with an elongation at break >10% and a $T_g$>0° C., component C being at least one mono- or multifunctional, heat-curable component preferably forming a second polymerized network with a $T_g$>100° C., serving as a $T_g$-enhancer (TGE), wherein optionally a partial content of light-curable component B is substituted by a light-curable crosslinking component D referred to as crosslinking agent (CA) that copolymerizes with components A and B via a corresponding curing mechanism for enhancing processability, wherein the amount of the light-curable component A ranges from 5 wt % to 80 wt %, the amount of the light-curable component B ranges from 10 wt % to 90 wt %, the amount of the heat-curable component C ranges from 1 wt % to 50 wt %, based on the total weight of components A, B and C, and optionally the amount of the crosslinking component D ranges from 3 wt % to 70 wt % based on the total weight of components B and D.

In a preferred embodiment the resin composition comprises a photoinitiating system that renders the composition light-curable and a thermal initiating system that renders the composition heat-curable. In another preferred embodiment the resin composition is storage stable at ambient conditions with the second or multiple further curing steps being latent and selectively triggered simultaneously or subsequently to the first light-curing step.

The inventive resin composition is capable of forming tough materials with improved thermal properties through a two-step process, comprising a first light-curing step where preferentially components A and B (and optionally D, if present) polymerize or copolymerize and a second or multiple further heat-curing steps, that preferentially cure component C (see FIGS. 2 and 3). Resulting materials are exceptional in terms of high toughness (e.g., measured by elongation at break) combined with high heat resistance (e.g., measured by glass transition temperature $T_g$), when compared to their respective counter parts not comprising component C, but instead only comprising a crosslinking agent D, that is also preferentially polymerized in a first light-curing step together with components A and B. The resulting photopolymer network can be identified as an interpenetrating network (IPN) and dependent on the composition of the hybrid resin formulation will yield a full-IPN, a semi-IPN, a pseudo-IPN, a dual network or a polymer blend. Within the inventive resin composition, the light-curable components A, B and optionally D are responsible for forming a tough photopolymer network via a light-curing step (e.g., enabling processing via L-AMTs) and additional heat resistance is gained via the network formation of a second or multiple further resin parts (e.g., via heat-curing step of component C) to form a rigid secondary network. With this strategy heat resistance of a photopolymer material can be enhanced, without having to compromise for toughness, which is a critical challenge for state-of-the-art photopolymers in 3D-printing.

Component A is preferably selected so as to form a polymer backbone upon light-induced curing, said backbone having a $T_g>25°$ C. Preferably, said backbone has a $T_g>40°$ C., even more preferably a $T_g>100°$ C. Any component A is considered fulfilling this requirement that, if taken alone, produces a polymer having the respective minimum $T_g$ after full polymerization. The glass-transition temperature $T_g$ of a material characterizes the range of temperatures over which this glass transition occurs. The glass-transition temperature is measured by means of a dynamic mechanical analysis (DMA) as described in the example section of the present application.

Component B is preferably selected so as to form a polymerized network upon light-induced curing, said polymerized network having an elongation at break >10% and a $T_g>0°$ C. Preferably, the elongation at break is >20%. Preferably, the $T_g$ is >25° C. Any component B is considered fulfilling this requirement that, if taken alone, produces a polymer having the respective minimum elongation at break and the respective minimum $T_g$ after full polymerization. The elongation at break is measured according to a standardized tensile testing method as defined in international standard ISO 527-1 (published in February 2012), with a ProLine Z010 TH material tester from Zwick/Roell, using 5A specimens. The tensile test is conducted at a strain rate of 1 mm min$^{-1}$ within an elongation of 0.05-0.25%, and then the measurement is continued with a strain rate of 10 mm min$^{-1}$. The glass-transition temperature $T_g$ is measured as indicated for component A above.

Component C is preferably selected so as to form a polymerized network upon heat-induced curing, said polymerized network having a $T_g>100°$ C. Any component C is considered fulfilling this requirement that, if taken alone, produces a polymer having a $T_g>100°$ C. after full polymerization. The glass-transition temperature $T_g$ is measured as indicated for component A above.

According to a further aspect, the inventive resin composition for the 3D-printing of objects comprises the following polymerizable components A, B and C:

A) A monofunctional, light-curable component A having the formula (I), also referred to as reactive diluent or RD, comprising a reactive species Y that is susceptible of radical or cationic polymerization and a side group X, said component A upon light-induced curing forming a polymer backbone with a $T_g>25°$ C., preferably with a $T_g>40°$ C., even more preferably with a $T_g>100°$ C., $$X-Y \qquad \text{Formula (I)}$$

wherein

Y is a chemical species chosen from the groups of (meth)acrylate, (meth)acrylamide, vinyl ester, vinyl ether, vinyl amide, N-vinyl compounds, vinyl carbonate, vinyl carbamate, maleimide, itaconate, fumarate, styrene compounds, cyclic ethers such as epoxy compounds or oxetanes, oxazolines, benzoxazines, cyanoacrylates, as well as derivatives thereof, which are optionally substituted with one or more $C_1$-$C_6$ alkyl, $C_1$-$C_6$ alkoxy, $C_1$-$C_6$ thioether, halogen, —$NO_2$, —$SO_3H$, —$CF_3$, —OH, —$NH_2$, —SH, —CN, -trimethoxysilyl, or -triethoxysilyl, X represents a linear, branched or cyclic, bicyclic or polycyclic $C_5$-$C_{40}$ aliphatic, heterocyclic or aromatic residue of one or more of the group consisting of methyl, ethyl, propyl, butyl, pentyl, hexyl, 2-ethylhexyl, octyl, decanyl, dodecanyl, acetic, propanoic, butanoic, pentanoic, undecanoic, dodecanoic, benzoic acid and corresponding esters, alkyl or aromatic esters, phenyl, benzyl, phenethyl, biphenyl, naphthyl, anthracenyl, pyrenyl, cyclopropyl, cyclobutyl, cyclopentyl, cyclohexyl, 4-isobutylcyclohexyl, cycloheptyl, cyclooctyl, adamantyl, isobornyl, salicyl, and cholesteryl, where one or more of these groups can be individually linked via an ester, amide, urea, urethane, carbonate, ether, or thioether group to form component A, which are optionally substituted with one or more $C_1$-$C_6$ alkyl, $C_1$-$C_6$ alkoxy, $C_3$-$C_7$-cycloalkyl, $C_6$-$C_{10}$-aryl, $C_1$-$C_6$ thioether, halogen, —$NO_2$, —$SO_3H$, —$CF_3$, —OH, —$NH_2$, —SH, —CN, -trimethoxysilyl, or -triethoxysilyl.

Preferred components A are monomers that form homopolymers and/or polymer backbones upon curing comprising rigid groups such as cyclic, bicyclic or polycyclic $C_5$-$C_{40}$ aliphatic, heterocyclic or aromatic residues.

Preferred components A are monomers that form homopolymers or polymer backbones upon curing with a $T_g$ higher than 40° C., or higher than 60° C., or higher than 80° C., or higher than 100° C., or from 50° C. to 100° C., or from 80° C. to 120° C., or from 100° C. to 150° C., or from 120° C. to 160° C., or from 150° C. to 200° C. The respective polymer backbones could be formed via thermal or photochemical curing reactions, which are polymerization methods known to the expert in the field. For example, as thermal initiator an organic peroxide such as benzoyl peroxide could be used in an amount of 0.1-5 wt % or as photoinitiating species either a radical photoinitiator such as 1-hydroxycyclohexyl phenyl ketone in amounts from 0.2-5 wt % or a cationic photoinitiator such as triphenyl sulfonium or diphenyl iodonium salts having anions such as borate, phosphate, arsenic, antimonate, tetrakis borate, in amounts from 0.5-10 wt % could be used. For thermal polymerization the reaction temperature is adjusted to the respective thermal initiator used or in case of photocuring, the applied light impulse is adjusted for the implemented photoinitiating system. The polymer samples could be cured as thin film or bulk sample via molding, sheet lamination or 3D-printing techniques. The polymer backbone being formed is characterized in that it exhibits an average number molecular weight of >5000 g mol$^{-1}$.

Some preferred but non-limiting examples for component A include monofunctional (meth)acrylates, (meth)acrylamides, vinyl ester, N-vinyl compounds such as:

Isobornyl (meth)acrylate, cyclohexyl (meth)acrylate, trimethyl-cyclohexyl (meth)acrylate, glycerol formal (meth)acrylate, tricyclodecane methanol mono(meth)acrylate, 4-tert-butylcyclohexyl (meth)acrylate, benzyl (meth)acrylate, phenoxyethyl (meth)acrylate, cyclic trimethylolpropane formal (meth)acrylate, salicylate (meth)acrylates such as 2-(methacryloyloxy)benzoic acid cyclopentyl ester, 2-(methacryloyloxy)benzoic acid cyclohexyl ester, 2-(methacryloyloxy)benzoic acid-2-isopropyl-5-methylcyclohexyl ester, 3-(methacryloyloxy)benzoic acid-2-isopropyl-5-methylcyclohexyl ester, 4-(methacryloyloxy)benzoic acid-2-isopropyl-5-methylcyclohexyl ester, 2-(methacryloyloxy)benzoic acid-3,3,5-trimethylcyclohexyl ester, 2-(acryloyloxy)benzoic acid-3,3,5-trimethylcyclohexyl ester, 2-(methacryloyloxy)benzoic acid decahydronaphthalen-2-yl ester, 2-(methacryloyloxy)benzoic acid-1,3,3-trimethyl-2-bicyclo[2.2.1]heptanyl ester, 2-(methacryloyloxy)benzoic acid-1,7,7-trimethyl-2-bicyclo[2.2.1]heptanyl ester, 2-(methacryloyloxy)benzoic acid-bicyclo[2.2.1]heptan-2-yl methyl ester, 2-(methacryloyloxy)benzoic acid-2-cyclohexylethyl ester, 2-(methacryloyloxy)benzoic acid benzyl ester, 4-(methacryloyloxy)benzoic acid benzoate, 3-(methacryloyloxy)benzoic acid-4-isopropylbenzyl ester, 2-(acryloyloxy)benzoic acid benzyl ester, 2-(methacryloyloxy)benzoic acid phenethyl ester, 4-(methacryloyloxy)-3-methoxybenzoic acid-3-methoxybenzyl ester, 2-(methacryloyloxy)benzoic acid-1-phenylethyl ester, 4-((methacryloyloxy)methyl)benzoic acid cycloheptyl ester and 2-(methacryloyloxy)benzoic acid cyclohexyl methyl ester, cholesteryl (meth)acrylate, biphenyl (meth)acrylate, phenyl acrylamide, diacetone acrylamide, t-butyl acrylamide, N-acryloyl morpholine, N-vinyl pyrrolidone, N-vinyl caprolactam, N-vinyl formamide, vinyl cinnamate, vinyl methyl oxazolidinone, and 2-(allyloxymethyl)acrylic acid methyl ester.

Component A may also be composed of compositions comprising two, three or multiple different components described by formula I.

B) A mono- or multifunctional, light-curable component B, which copolymerizes with component A via a corresponding curing mechanism, having a number average molecular weight of >500 g mol$^{-1}$, preferably >1000 g mol$^{-1}$ having one or more chemical species chosen from the group comprised of (meth)acrylate, (meth)acrylamide, vinyl ester, vinyl ether, vinyl amide, N-vinyl compounds, vinyl carbonate, vinyl carbamate, maleimide, itaconate, fumarate, styrene compounds, cyclic ethers such as epoxy compounds or oxetanes, oxazolines, benzoxazines, cyanoacrylates, as well as derivatives and/or combinations thereof, with component B being at least one, optionally (poly)ether, (poly)ester, (poly)carbonate, (poly)urethane, (poly)siloxane, (poly)amide, (poly)isoprene, modified epoxy functionalized oligomers, which are optionally substituted with one or more $C_1$-$C_6$ alkyl, $C_1$-$C_6$ alkoxy, $C_3$-$C_7$-cycloalkyl, $C_6$-$C_{10}$-aryl, $C_1$-$C_6$ thioether, halogen, —NO$_2$, —SO$_3$H, —CF$_3$, —OH, —NH$_2$, —SH, —CN, -trimethoxysilyl, -triethoxysilyl, serving as a toughness modifier (TNM), preferably forming a polymerized network with an elongation at break >10%, preferably >20% and/or a $T_g$>0° C., preferably >25° C.

Preferred components B are multifunctional oligomers, prepolymers and/or polymers having an average reactive group functionality of >1.3, preferably >1.5, more preferred >1.9 or an average functionality between 0.9 and 2.1, or between 0.9 and 3.1 or between 2.9 and 3.1 or between 1.9 and 2.1.

Preferred components B are multifunctional oligomers, prepolymers and/or polymers having a number average molecular weight of >500 g mol$^{-1}$, preferably >1000 g mol$^{-1}$, more preferably >5000 g mol$^{-1}$, even more preferably >10000 g mol$^{-1}$ or a number average molecular weight between 700 g mol$^{-1}$ and 50000 g mol$^{-1}$, or 1000 g mol$^{-1}$ and 30000 g mol$^{-1}$, or 1000 g mol$^{-1}$ and 20000 g mol$^{-1}$, or 2000 g mol$^{-1}$ and 50000 g mol$^{-1}$, or 2000 g mol$^{-1}$ and 30000 g mol$^{-1}$, or 2000 g mol$^{-1}$ and 20000 g mol$^{-1}$.

Preferred components B are multifunctional oligomers, prepolymers and/or polymers that form homopolymers or crosslinked polymer networks upon curing with a $T_g$ higher than 25° C., or higher than 40° C., or higher than 60° C., or higher than 80° C., or higher than 100° C., or from 0° C. to 30° C., or from 10° C. to 40° C., or from 30° C. to 60° C., or from 40° C. to 80° C. and/or an elongation at break higher than 10%, or higher than 20%, or higher than 30%, or higher than 50%, or higher than 80%, or from 10% to 30%, or from 20% to 40%, or from 30% to 50%, or from 80% to 120%, or from 150% to 200%. The respective crosslinked polymer networks could be formed via thermal or photochemical curing reactions, which are polymerization methods known to the expert in the field (see description above). The polymer samples could be cured as thin film or bulk sample via molding, sheet lamination or 3D-printing techniques.

Some preferred examples for component B are multifunctional (meth)acrylates such as:

Ethoxylated bisphenol A di(meth)acrylates (e.g., Miramer 2200, Miramer 2301), aliphatic urethane di(meth)acrylates (e.g., Ebecryl 8811, Ebecryl 8809, Ebecryl 8409, Ebecryl 246, Miramer PU2100, Miramer SC2404, Miramer SC2565, Miramer PU2564, BR-571 MB, BR-7432GB, CN9001, CN965, CN981, CN8881 NS), polyether urethane (meth)acrylates (e.g., BR-541 MB, BR-582H15 already including 10-25% component D as CA), hydrophobic urethane (meth)acrylates (e.g., BRC-443D already including 5-15% component A as RD), polyester urethane (meth)acrylates (e.g., BR-744 BT), polyester di(meth)acrylates (e.g., CN2608A, CN704, CN790), modified epoxy di(meth)acrylates (e.g., CN2003EU), oligomeric polycarbonate di(meth) acrylates.

Component B may also be composed of compositions comprising two, three or multiple different components B as described.

C) A mono- and/or multifunctional, heat-curable component C, serving as a $T_g$-enhancer (TGE), preferably forming a second polymerized network with a $T_g$>100° C., preferably >150° C., even more preferably >200° C. having one or more chemical species chosen from the group comprised of allyl, vinyl, maleimide, citraconimide, benzoxazine, epoxy, phenol, cyanate ester, phthalonitrile and oligomers or polymers thereof and/or isomers thereof and/or combinations thereof, furthermore rendering the final formulation storage stable at ambient conditions with the second or further multiple curing steps being latent and selectively triggered simultaneously or subsequently to the first light-curing step. The respective crosslinked polymer networks could be formed via thermal curing reactions, which are polymerization methods known to the expert in the field (see description above). The polymer samples could be cured as thin film or bulk sample via molding, sheet lamination or 3D-printing techniques.

Preferred components C are mono- and/or multifunctional, heat-curable components, which are responsible for forming a second polymerized network with a $T_g$>100° C., preferably >150° C., more preferably >180° C., even more preferably >200° C. or a $T_g$ from 80° C. to 120° C., or 120° C. to 150° C., or 150° C. to 180° C., or 180° C. to 220° C., or 220° C. to 250° C., or 250° C. to 300° C., thus said components provide for an improved heat resistance (e.g., measured by $T_g$ or heat deflection temperature HDT) of the final photopolymer network while maintaining toughness (e.g., measured by elongation at break).

Preferred components C are mono- and/or multifunctional, heat-curable components that are
i) comprising rigid substituents responsible for the formation of polymer backbones or polymer networks providing the required high $T_g$, such as aromatic and/or cycloaliphatic groups and/or heterocyclic groups and/or groups exhibiting strong intermolecular forces, further providing a low tendency toward polymerization shrinkage, such components preferably being oligomers and/or prepolymers with higher molecular weight (number average molecular weight>500 g mol$^{-1}$), and/or
ii) of low molecular weight (number average molecular weight<500 g mol$^{-1}$), which results in higher crosslinking densities, thus overall higher heat resistance, and/or
iii) of high functionality (>2) with respect to reactive groups, which results in higher crosslinking densities, thus overall higher heat resistance.

Preferred components C can be efficiently cured via a heat-curing step that is performed subsequently to the light-curing step for components A, B and optionally D, wherein the heat-curing step is performed at a temperature that is higher than the initial processing temperature for the light-curing step, preferably at >100° C., more preferably >120° C., even more preferably >140° C. and at a temperature where the formed material still exhibits sufficient thermal stability, preferably <250° C., more preferably <200° C., even more preferably <180° C.

Preferred components C can be efficiently cured via a heat-curing step that is performed subsequently to the light-curing step for components A, B and optionally D, wherein the heat-curing step is performed by applying heat directly via active heating in an oven (e.g., electric, gas or solar oven) or indirectly via microwave irradiation, other light impulses (such as infra-red light) or secondary exothermic reactions such as thermal polymerization and/or combinations thereof.

Some other preferred components C can be efficiently cured via a second curing step that is performed simultaneously or subsequently to the first light-curing step, wherein the resin components are cured simultaneously by light via a different curing mechanism (e.g., cationic vs radical curing) or simultaneously or subsequently in a second curing step by light of a wavelength different from the first light-curing step (e.g., radical curing at wavelengths>390 nm and cationic curing at wavelengths<380 nm).

Some more preferred examples for component C exhibit a softening or melting temperature within the processing range for Hot Lithography being 30-150° C., more preferably 30-120° C. and/or exhibit a viscosity of 0.5 to 1000 Pa s at processing temperature being in the range of 30-150° C., more preferably 30-120° C.

In a preferred embodiment, the heat-curable component C is responsible for forming a secondary polymer network upon the subsequently triggered heat-curing step, which improves network heterogeneity as suggested in FIGS. 2 and 3. In this way, the cured material constitutes
i) an interpenetrating polymer network; or
ii) a semi-interpenetrating polymer network; or
iii) a sequential interpenetrating polymer network; or
iv) a polymer blend Some preferred examples for component C are heat-curable components having one or more chemical species chosen from the group consisting of monomers and/or oligomers and/or prepolymers of maleimide and citraconimide derivatives according to formula (II),

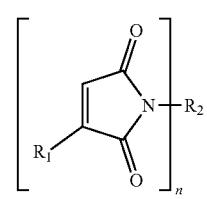

Formula (II)

as well as isomers thereof, in particular itaconimide, wherein
n is an integer between 1 and 10
$R_1$ represents H, $CH_3$ or $CH_2$,
$R_2$ independently represents a linear, branched or cyclic $C_5$-$C_{40}$ aliphatic or aromatic residue of one or more of the group consisting of methyl, ethyl, propyl, butyl, pentyl, hexyl, 2-ethylhexyl, octyl, decanyl, dodecanyl, acetic, propanoic, butanoic, pentanoic, undecanoic, dodecanoic, benzoic acid and corresponding esters, alkyl or aromatic esters, cyclopropyl, cyclobutyl, cyclopentyl, cyclohexyl, 4-isobutylcyclohexyl, cycloheptyl, cyclooctyl, adamantyl, isobornyl, salicyl, cholesteryl, phenyl, benzyl, phenethyl, propenyl, biphenyl, naphthyl, anthracenyl, pyrenyl, bis(methylene)oxy, bis(ethylene)oxy, bis(phenyl)methane, bis(phenyl)ethane, bis(phenyl)propane, bis(phenyl)butane, bis(phenyl)ether, bis(phenyl)thioether, bis(phenyl)amino and bis(phenyl)sulfone, where one or more of these groups are optionally, individually linked via an ester, amide, urea, urethane, carbonate, ether, thioether group, which are optionally substituted with one or more $C_1$-$C_6$ alkyl, $C_1$-$C_6$ alkoxy, $C_1$-$C_6$ thioether, halogen, —$NO_2$, —$SO_3H$, —$CF_3$, —OH, —$NH_2$, —SH, —CN, -trimethoxysilyl, -triethoxysilyl or a polymerisable group from the substance classes of maleimide and citraconimide compounds and/or isomers thereof, in particular itaconimide.

Some more preferred examples for component C are mono- and multifunctional maleimide species of formula II in which $R_2$ represents aromatic residues, which bring about higher heat resistance due to the rigid molecular architecture, a high degree of crosslinking and reduce light curability, which improves network heterogeneity as suggested in FIGS. 2 and 3. It is therefore preferred that component C comprises a species of formula II with n being an integer from 1 to 10 having an aromatic residue linked to the N-atom of the maleimide ring either directly or via a methylene spacer. Such preferred species of component C are in particular represented by the following formulae and/or oligomers and/or prepolymers of these derivatives, as well as isomers thereof, in particular itaconimide:

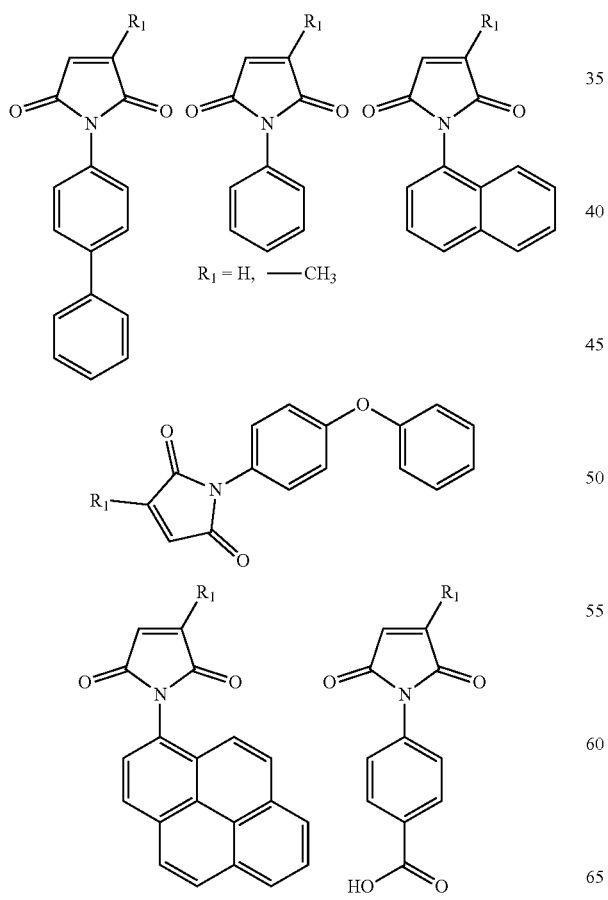

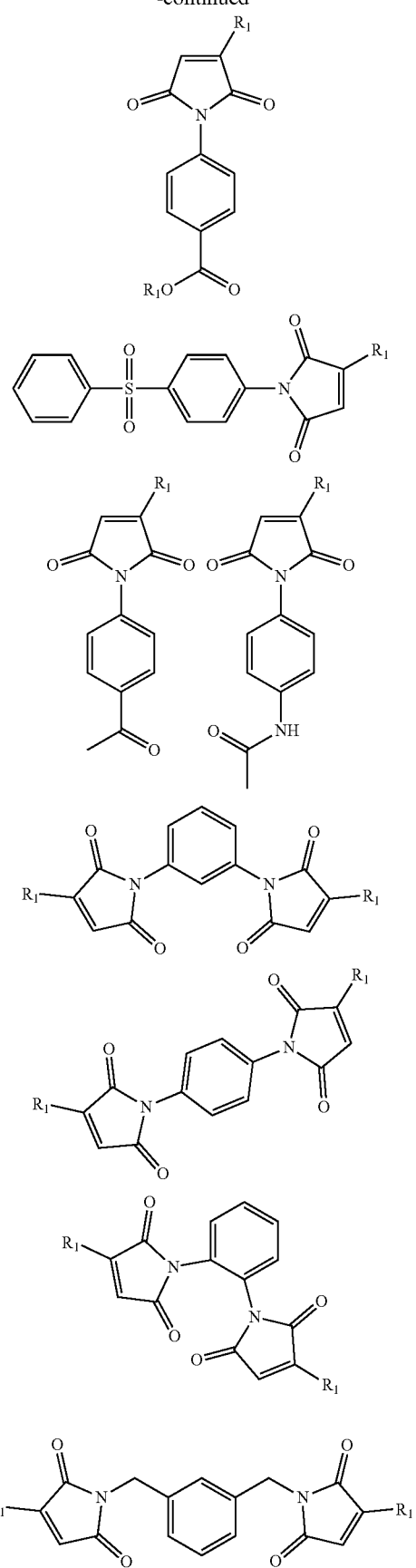

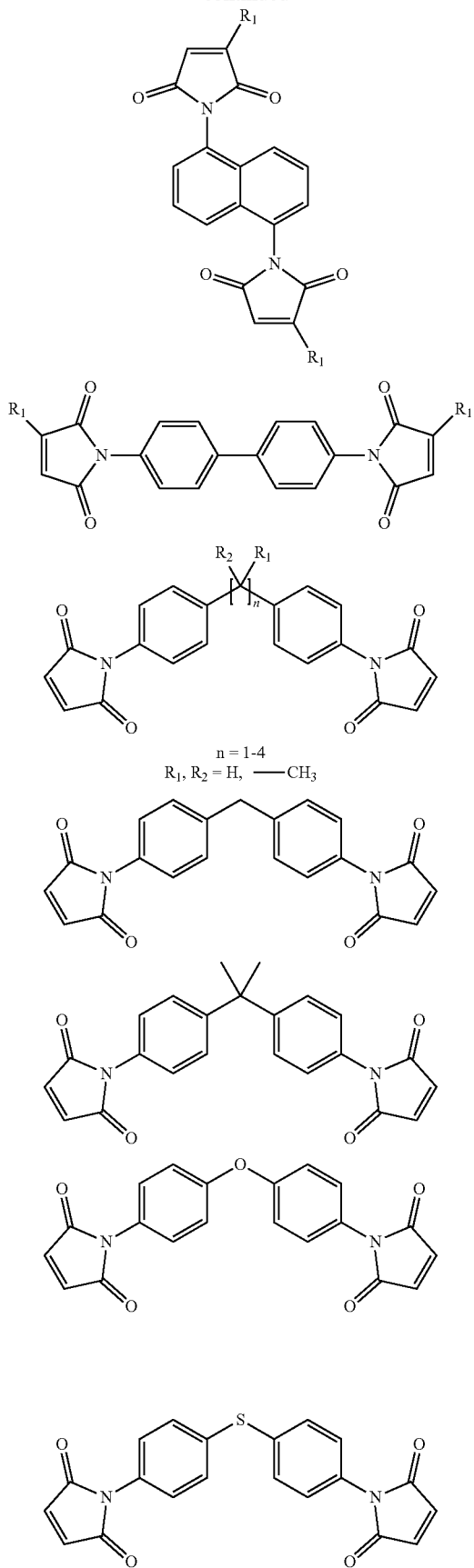
Some other preferred examples for component C are multifunctional allyl compounds comprising rigid substituents responsible for the formation of polymer backbones or polymer networks providing the required high $T_g$, such as aromatic and/or cycloaliphatic and/or heterocyclic groups and/or groups exhibiting strong intermolecular forces, further providing a low tendency toward polymerization shrinkage and such components are preferably already oligomers and/or prepolymers with higher molecular weight (number average molecular weight>500 g mol$^{-1}$), or of low molecular weight (number average molecular weight<500 g mol$^{-1}$), and/or of high functionality (>2) with respect to reactive groups, which both results in higher crosslinking densities, thus overall higher heat resistance.

Some preferred examples for multifunctional allyl compounds as component C are:

1,3,5-triallyl-1,3,5-triazine-2,4,6(1H,3H,5H)-trione, 2,4,6-triallyloxy-1,3,5-triazine, triallyl borate, triallyl 1,3,5-benzenetricarboxylate, triallyl citrate, triallyl phosphate, tetraallyl pyromellitate, tetraallyloxyethane, diallyl propyl isocyanurate, diallyl isocyanurate, diallyl phthalate, 2,2-bis(4-allyloxy-3,5-dibromophenyl)propane, diallyl dicarbonate, diallyl carbonate, diallyl 1,4-cyclohexanedicarboxylate, 2,2-diallyl bisphenol A diacetate ether, diallyl terephthalate, diallyl isophthalate, diethyl diallylmalonate, 1,3-diallylurea, 1,3-diallyl-2-thiourea, 2,4-diamino-6-diallylamino-1,3,5-triazine, diallyl oxalate, diallyl malonate, diallyl tetrabromophthalate, 2,6-diallyl-meta-cresol, N,N-diallylaniline, diallyl cyanamide, N,N-diallylmelamine, 2,2'-diallylbisphenol A, N,N'-diallylpiperazine, 2,2-diallylpyrrolidine, diallyl-carbamic acid tert-butyl ester, diallyl ether bisphenol A, diallyl phenylphosphonate, 5,5'-diallyl-[1,1'-biphenyl]-2,2'-diol, cyclohexanone diallyl acetal, 4,4'-diallyl-1,1'-biphenyl, 2,2-diallyl-4,4-biphenol.

Some other preferred examples for component C are multi-functional epoxy compounds comprising rigid substituents responsible for the formation of polymer backbones or polymer networks providing the required high $T_g$, such as aromatic and/or cycloaliphatic and/or heterocyclic groups and/or groups exhibiting strong intermolecular forces, further providing a low tendency toward polymerization shrinkage and such components are preferably already oligomers and/or prepolymers with higher molecular weight (number average molecular weight>500 g mol$^{-1}$), or of low molecular weight (number average molecular weight<500 g mol$^{-1}$), and/or of high functionality (>2) with respect to reactive groups, which both results in higher crosslinking densities, thus overall higher heat resistance.

Some preferred examples for multifunctional epoxy compounds as component C are:

Bisphenol A, bisphenol F and/or bisphenol S derivatives such as bisphenol A diglycidyl ether, bisphenol F diglycidyl ether, bisphenol S diglycidyl ether and/or diglycidyl 1,2-cyclohexanedicarboxylate, 4,4'-methylenebis(N,N-diglycidylaniline), trimethylolpropane triglycidyl ether, (3',4'-epoxycyclohexane)methyl-3,4-epoxycyclohexylcarboxylate, condensation products of 1-2-epoxy-4(2-oxiranyl)-cyclohexane and 2,2-bis(hydroxy methyl)1-butanol, bisphenol A novolac epoxy resins (e.g., SU-8 resin) and/or oligomers and/or prepolymers of these derivatives.

Component C may also be composed of compositions comprising two, three or multiple different components C as described above.

The relative amounts of components A, B and C within the hybrid resin composition may be chosen such that the amount of the light-curable component A ranges from 5 wt % to 80 wt %, preferably from 10 wt % to 60 wt %, more preferably from 15 wt % to 55 wt % and even more preferably from 20 wt % to 45 wt % based on the total weight of components A, B and C, the amount of the light-curable component B ranges from 10 to 90 wt %, preferably from 20 wt % to 80 wt %, more preferably from 25 wt % to 70 wt %, even more preferably from 30 wt % to 65 wt % based on the total weight of components A, B and C, and the amount of the heat-curable component C ranges from 1 to 50 wt %, preferably from 2 wt % to 40 wt %, more preferably from 3 wt % to 30 wt %, even more preferably from 5 wt % to 25 wt %, based on the total weight of components A, B and C.

By way of example, preferred combinations of ranges for components A-C within the hybrid resin composition can be derived from the following table or from the herein disclosed non-limiting examples:

| Components | Exemplary composition 1 | Exemplary composition 2 | Exemplary composition 3 | Exemplary composition 4 |
|---|---|---|---|---|
| A | 20-35 wt % | 20-30 wt % | 15-25 wt % | 40-50 wt % |
| B | 55-70 wt % | 50-60 wt % | 65-75 wt % | 35-45 wt % |
| C | 5-15 wt % | 10-20 wt % | 5-15 wt % | 10-20 wt % |

Component A, the reactive diluent, of the resin formulation is composed of one or more monofunctional substances composed of reactive groups, meaning that such components can undergo a polymerization reaction, either via a radical or cationic curing mechanism triggered by light. Component A preferably has a low molecular weight of <750 g mol$^{-1}$ and a lower viscosity than the oligomeric component B, preferably <5 Pa s at processing temperature in order to achieve better processability of the inventive resin formulation in an additive fabrication process.

In a preferred embodiment the reactive diluent forms a polymer backbone with a $T_g$>25° C., to bring about faster gelation and higher green strength for the light-cured photopolymers. In a preferred embodiment the monofunctional reactive diluent yields a lower crosslinking density in the final photopolymer network, which brings about higher toughness and a more ductile behavior. In a preferred embodiment the reactive species Y of component A comprises radically polymerizable groups such as, but not limited to, (meth)acrylate, (meth)acrylamide, vinyl ester, vinyl ether, vinyl amide, N-vinyl compounds, vinyl carbonate, vinyl carbamate, maleimide, itaconate, fumarate, and styrene compounds.

In a further preferred embodiment such reactive diluents can undergo cyclopolymerization to form a rigid, cyclic polymer backbone bringing about higher green strength and higher $T_g$. By way of example such cyclopolymerizable reactive diluents are comprised of two reactive groups, which are susceptible to radical attack, yet do not undergo homopolymerization by itself (e.g., 2-(allyloxymethyl) acrylic acid methyl ester).

Preferably, the resin composition is devised in such a manner, that the component B comprises radically polymerizable groups such as (meth)acrylate, (meth)acrylamide, vinyl ester, vinyl ether, vinyl amide, N-vinyl compounds, vinyl carbonate, vinyl carbamate, maleimide, itaconate, fumarate, and styrene compounds. More preferably the component B comprises a multifunctional (meth)acrylate or (meth)acrylamide and/or a mixture of mono- or multifunctional (meth)acrylates and/or (meth)acrylamides with an average molecular weight>1000 g mol$^{-1}$. Such (meth)acrylate or (meth)acrylamide oligomers are components with two or more radically polymerizable groups or at least an average number of reactive functionalities >1.3 on the oligomer. The high molecular weight oligomers are responsible for forming a tough photopolymer network, as such oligomers of high molecular weight and reactive end groups yield toughening within the final photopolymer network through chain flexibility and chain entanglements.

In more preferred embodiments component B is complemented or substituted by a crosslinking component D (crosslinking agent CA), which is also light-curable and copolymerizes with components A and B via a corresponding curing mechanism, having one or more chemical species chosen from the group comprised of (meth)acrylate, (meth) acrylamide, vinyl ester, vinyl ether, vinyl amide, N-vinyl compounds, vinyl carbonate, vinyl carbamate, maleimide, itaconate, fumarate, styrene compounds, cyclic ethers such as epoxy compounds or oxetanes, oxazolines, benzoxazines, cyanoacrylates, as well as derivatives and/or combinations thereof, with component D being added for better processability and higher green strength, if required. Multifunctional monomers making up component D are possibly tri-, tetra-, penta and/or hexafunctional CAs and/or hyperbranched and/or dendritic CAs having even more functional sites. These are suitable for reasons of fast reaction rates and high crosslinking densities, improve heat resistance (e.g., higher $T_g$), but typically decrease toughness.

In more preferred embodiments component B is complemented or substituted by a crosslinking component D (crosslinking agent CA) as such that the formulations related to this invention are composed of at least one di- and/or multifunctional (meth)acrylate or a mixture of di- and/or multifunctional (meth)acrylates. This component D can be composed from one or multiple radically polymerizable oligomers and hence oligomers polymerizable by light and are therefore specifically preferred as part of the light-curable component matrix and as an addition to component B of the inventive resin composition. Multifunctional monomers making up component D are possibly tri-, tetra-, penta and/or hexafunctional (meth)acrylates and/or hyperbranched and/or dendritic (meth)acrylates having even more functional sites. These are suitable for reasons of fast reaction rates and high crosslinking densities, improved heat resistance (e.g., higher $T_g$), but typically compromise toughness.

Some preferred compounds of component D of the inventive resin composition are multifunctional (meth)acrylates and/or a mixture of multifunctional (meth)acrylates, which bring about higher green strength of the 3D-printed part to support 3D-structuring of complex, thin-walled structures. Said crosslinking components are different from component B as they either have a low molecular weight (<500 g mol$^{-1}$) or higher functionality (>2), which both result in higher crosslinking densities, thus overall higher green strength.

Such crosslinking components D are in particular 1,4-butanedioldi(meth)acrylate, 1,6-hexanedioldi(meth)acrylate, 1,10-decanedioldi(meth)acrylate or 1,12-dodecanedioldi-(meth)acrylate, 1,6-bis-[2-(meth)-acryloyloxyethoxycarbonylamino]-2,2,4-trimethylhexane, pentaerythrittetra(meth)acrylate, di-, tri- or tetraethylenglycol-di(meth)acrylate and/or trimethylolpropantri(meth)acrylate.

Furthermore, preferred components D are composed of rigid groups such as aromatic or cycloaliphatic groups for reasons of low tendency toward polymerization shrinkage, high green strength, and high heat resistance of the cured resin. Some preferred crosslinking components D are 2-(2-biphenyloxy)-ethyl(meth)acrylate, bisphenol-A-di(meth)acrylate (an addition product from (meth)acrylic acid and bisphenol-A-diglycidylether), ethoxy- or propoxylated bisphenol-A-di(meth)acrylate (e.g., 2-[4-(2-(meth)acryloyloxyethoxyethoxy)phenyl]-2-[4-(2-(meth)acryloyloxyethoxy)phenyl]-propane) or 2,2-bis[4-(2-(meth)acryloxypropoxy)phenyl]propane, tricyclodecanedimethanol di(meth)acrylate, isophorone urethane di(meth)acrylate, or tris(2-hydroxy ethyl)isocyanurate tri(meth)acrylate.

Preferably, the amount of monofunctional component A ranges from 5 wt % to 80 wt %, preferably from 10 wt % to 60 wt %, more preferably from 15 wt % to 55 wt % and even more preferably from 20 wt % to 45 wt % based on the total weight of components A, B, C and D, the amount of the light-curable component B ranges from 10 wt % to 90 wt %, preferably from 20 wt % to 80 wt %, more preferably from 25 wt % to 70 wt %, even more preferably from 30 wt % to 65 wt % based on the total weight of components A, B, C and D, the amount of the mainly heat-curable component C ranges from 1 wt % to 50 wt %, preferably from 2 wt % to 40 wt %, more preferably from 3 wt % to 30 wt %, even more preferably from 5 wt % to 25 wt % based on the total weight of components A, B, C and D, and the amount of the crosslinking component D ranges from 3 wt % to 70 wt %, preferably from 5 wt % to 60 wt %, more preferably from 7 wt % to 50 wt %, even more preferably from 10 wt % to 40 wt % based on the total weight of components B and D.

By way of example, preferred combinations of ranges for components A-D within the hybrid resin composition can be derived from the following table or from the herein disclosed non-limiting examples:

| Components | Exemplary composition 5 | Exemplary composition 6 | Exemplary composition 7 | Exemplary composition 8 | Exemplary composition 9 | Exemplary composition 10 |
|---|---|---|---|---|---|---|
| A | 25-35 wt % | 15-25 wt % | 20-30 wt % | 5-15 wt % | 25-30 wt % | 40-50 wt % |
| B | 40-50 wt % | 55-70 wt % | 40-50 wt % | 60-65 wt % | 55-65 wt % | 25-35 wt % |
| C | 15-20 wt % | 5-10 wt % | 10-20 wt % | 10-20 wt % | 5-10 wt % | 10-15 wt % |
| D | 5-10 wt % | 5-10 wt % | 10-20 wt % | 10-15 wt % | 5-10 wt % | 10-15 wt % |

According to a preferred embodiment of the present invention, the inventive resin composition comprises at least one photoinitiator suitable for radical polymerization upon light excitation, preferably light excitation within the wavelength spectrum of 150 nm to 1000 nm, more preferably between 200 nm to 550 nm, preferably in amounts of 0.01 wt % to 10 wt %, preferably 0.1 wt % to 7 wt %, more preferably 0.2 wt % to 5 wt % based on the total weight of components A, B and D. This means the photoinitiators can be activated with light and initiate polymerization of the light-curable components of the formulation.

The light-initiated polymerization (photopolymerization) is successful, when the applied light exposure is of a suitable wavelength for activating the photoinitiator and is of sufficient power. Aside from the light exposure being adequate for the photoinitiator, the overall formulation (optionally including light absorbing monomers or additives) may not interfere with the interaction of the emitted light and the photoinitiator. Light exposure applied herein includes any wavelength and power being able to initiate polymerization. Preferred wavelengths of light are 150 nm to 1000 nm, even more preferred between 200 nm to 550 nm. Any suitable NIR, UV or visible light source may be used, including but not limited to lasers or LED sources or broadband Hg-lamps. The light source may emit a broadband or narrowband light spectrum, or a combination thereof. The light source may emit continuous or pulsed light during single or repeated exposure periods, which may additionally be varied via time or intensity of exposure. A suitable and elevated process temperature will increase the reactivity of the system and thus enhance the light-induced structuring process. Adjusting the parameters and variables above will lead to an optimized protocol for carrying out the described photopolymerization reaction, yielding optimal 3D-processing via L-AMTs.

In a preferred embodiment, the light-induced curing step is carried out utilizing NIR (near infrared)- or UV/Vis (ultraviolet visible) light sources and corresponding optics, wherein the NIR-configuration is selected to enable 3D-fabrication via two photon photopolymerization and the UV/Vis-configuration is selected from the group consisting of laser/DLP, LED/DLP, laser/LCD, and LED/LCD.

Preferred photoinitiators are Norrish type I photoinitiators alone or in combination with each other and may be selected from the group consisting of α-hydroxyketones, phenylglyoxylates, benzyldimethylketals, α-aminoketones, mono- or bisacylphosphines, -phosphineoxides, mono-, bis- or tetraacylsilanes, -germanes, -stannanes, metallocenes. Some preferred examples are 2-hydroxy-2-methylpropiophenone, 1-hydroxycyclohexyl phenyl ketone, methyl phenyl glyoxylates, 2-benzyl-2-(dimethylamino)-4'-morpholinobutyrophenone, [1-(4-phenylsulfanylbenzoyl)heptylideneamino] benzoate, [1-[9-ethyl-6-(2-methylbenzoyl)carbazol-3-yl] ethylideneamino] acetate, 2,4,6-trimethylbenzoyldiphenylphosphine oxide (TPO), ethyl-(2,4,6-trimethylbenzoyl)phenyl phosphinate (TPO-L), phenylbis(2,4,6-trimethylbenzoyl)phosphine oxide (BAPO), ethyl (3-benzoyl-2,4,6-trimethylbenzoyl) (phenyl) phosphinate, bis(4-methoxybenzoyl)diethylgermane (BMDG), and bis (cyclopentadienyl) bis[2,6-difluoro-3-(1-pyrryl) phenyl] titanium and/or polymeric type I photoinitiators such as Ominpol TP.

Preferred photoinitiators may also be Norrish type II photoinitiators. Some preferred examples are benzophenones (e.g., benzophenone, 4-methyl benzophenone, 4,4'-bis(diethylamino)benzophenone), benzoin, diketones (e.g., 9,10-phenanthrenequinone, 1-phenyl-propane-1,2-dione, diacetyl or 4,4'-dichlorobenzil and/or derivatives thereof), and thioxanthones (e.g., chloropropoxythioxanthones, isopropylxanthones or 2,4-diethyl-9H-thioxanthen-9-one). Such type II photoinitiators may be used in combination with coinitiators such as tertiary amines (e.g., aromatic tertiary amines such as N,N-dialkylaniline, -p-toluidine or -3,5-xylidine, p-N,N-dialkylamino-phenylethanol, -benzoic acid derivatives, -benzaldehyde or triethanolamine.

In further preferred embodiments, a combination of said type I and/or type II photoinitiators may be used.

Resin compositions of the inventive type can be processed in lithography-based 3D-printing applications at elevated temperatures, in which the inventive resin composition is heated and subsequently subjected to a layer-by-layer, light-induced build-up step, in which the light-curable component of the inventive resin composition is structured by light-curing to obtain 3D-objects via a lithography-based additive manufacturing method yielding materials with the aforementioned desirable combined thermal and mechanical properties of improved temperature resistance (e.g., measured via $T_g$) with maintained toughness (e.g., measured via elongation at break) or vice versa.

In a preferred embodiment Hot Lithography is used as a processing method to enable the 3D-structuring of resins with a high content of component B, being oligomers or prepolymers thereof, which are usually characterized by high toughness (e.g., elongation at break >10%) and for conventional L-AMTs comparably high viscosities of the resin formulation (>15 Pa s at room temperature and 0.01-40 Pa s, preferably from 0.1-25 Pa s at processing temperature). In a preferred embodiment Hot Lithography is used as a processing method to enable the 3D-structuring of resins with a high content of component C, being rigid compounds and/or oligomers and/or prepolymers thereof, which are usually characterized by high softening or melting temperatures and high heat resistance of the final material (e.g., $T_g$>100° C.) and for conventional L-AMTs comparably high viscosities of the resin formulation (>15 Pa s at room temperature and 0.01-40 Pa s, preferably from 0.1-25 Pa s at processing temperature). The resulting materials offer improved thermal resistance while maintaining toughness or vice versa. This is substantiated by the herein disclosed (thermo)mechanical properties for 3D-specimens produced via L-AMTs.

In some preferred embodiments the heat-curable component C does not cure unless subjected to heat, meaning temperatures>50° C., rendering the heat-curable system being latent and inherently forming a resin formulation that is storage stable at room temperature, meaning having a storage stability >3 months or even >6 months or even >12 months (e.g., measured by an increase in viscosity <10%) and the 3D-object is produced by the process of Hot Lithography.

In preferred embodiments, said heat-curing step may be achieved via active heating in an oven (e.g., electric, gas or solar oven) or indirectly via microwave irradiation, other light impulses (such as infra-red light) or secondary exothermic reactions such as thermal polymerization. Preferably, the heat-curable component C is stable at ambient conditions and at processing conditions of the light-curing step, thus a latent curing reaction needs to be induced.

In some preferred embodiments, at least one thermal initiator and/or catalyst may be used for the heat-curing of component C and/or its comonomers. Suitable catalysts may preferably be selected from the group consisting of tertiary amines (e.g., trialkylamines), in particular DABCO and/or DMAP and/or triethylamine and/or other aliphatic and aromatic secondary and tertiary amines, alkali salts of organic alcohols, phosphines, triphenyl phosphonate, imidazoles, in particular substituted imidazoles such as 2-methyl-1-vinyl imidazole, 2-phenylimidazole, 2-benzylimidazole and/or 2-ethyl-4-methyl imidazole, organic acids, and/or peroxides and/or dicyandiamide, preferably in amounts of 0.01 wt % to 20 wt %, preferably 0.1 wt % to 15 wt %, more preferably 0.2 wt % to 10 wt % based on the weight of component C.

For preferred maleimide compounds as component C such thermal initiators and/or catalysts may be selected from the group consisting of tertiary amines (e.g., trialkylamines), in particular anionic catalysts such as DABCO and/or DMAP and/or triethylamine and/or other aliphatic and aromatic secondary and tertiary amines, alkali salts of organic alcohols, phosphines such as trialkylphosphines, triphenyl phosphines, imidazoles, in particular substituted imidazoles s such as 2-methyl-1-vinyl imidazole, 2-phenylimidazole, 2-benzylimidazole and/or 2-ethyl-4-methyl imidazole, organic acids, and/or peroxides such as dibenzoyl peroxide, dilauroyl peroxide, dicumyl peroxide, tert-butylperbenzoate and/or di-(tert-butyl)-peroxide and/or 1,1,2,2-tetraphenyl-1, 2-ethanediol, preferably in amounts of 0.01 wt % to 20 wt %, preferably 0.1 wt % to 15 wt %, more preferably 0.2 wt % to 10 wt % based on the weight of component C. Optionally, up to 2 wt % of a co-agent such as triallylcyanurate or bismaleimide in case of citraconimide-based components C can be used.

For preferred allyl compounds as component C such thermal initiators and/or catalysts may be selected from the group consisting of peroxides such as dibenzoyl peroxide, dilauroyl peroxide, dicumyl peroxide, tert-butylperbenzoate and/or di-(tert-butyl)-peroxide and/or 1,1,2,2-tetraphenyl-1, 2-ethanediol, preferably in amounts of 0.01 wt % to 20 wt %, preferably 0.1 wt % to 15 wt %, more preferably 0.2 wt % to 10 wt % based on the weight of component C. Optionally, up to 10 wt % of a co-agent such as bismaleimides can be used.

For preferred epoxy compounds as component C such thermal initiators and/or catalysts may be selected from the group consisting of dicyandiamide and/or accelerators such as tertiary amines (e.g., benzyl dimethylamine), imidazoles, in particular substituted imidazoles such as 2-methyl-1-vinyl imidazole, 2-phenylimidazole, 2-benzylimidazole and/or 2-ethyl-4-methyl imidazole, and/or ureas such as aryl dimethylurea compounds (e.g., Diuron, Fenuron or 3-(4-chlorophenyl)-1,1-dimethyl urea being Monuron) and/or carboxylic acid anhydrides (e.g., succinic anhydride, phthalic anhydride) and/or accelerators such as cobalt (III), nickel (II) or copper (II) acetylacetonates and/or dibasic acid dihydrazide and/or boron trifluoride-amine adduct, preferably in amounts of 0.01 wt % to 20 wt %, preferably 0.1 wt % to 15 wt %, more preferably 0.2 wt % to 10 wt % based on the weight of component C.

In further preferred embodiments the inventive resin composition comprises one or more initiators for radical polymerization, in particular thermal initiators, which are suitable for heat-curing of component C. Some preferred examples are azo compounds, more preferably 2,2'azobis (isobutyronitrile) (AIBN) and/or azobis-(4-cyanovaleric acid) and/or peroxides, more preferably organic peroxides such as dibenzoyl peroxide, dilauroyl peroxide, dicumyl peroxide, tert-butylperbenzoate and/or di-(tert-butyl)-peroxide and/or 1,1,2,2-tetraphenyl-1,2-ethanediol, preferably in amounts of 0.01 wt % to 5 wt %, preferably 0.1 wt % to 4 wt %, more preferably 0.2 wt % to 3 wt % based on the total weight of components A-D.

In some preferred embodiments, the hybrid resin formulation further comprises a comonomer and/or cooligomer and/or coprepolymer, which is able to copolymerize with component C as well as with derivatives thereof.

For preferred maleimide compounds of component C such comonomers can preferably be selected from the group comprised of monomers and/or oligomers and/or prepolymers from alkenylphenol, alkenylphenyl ether, alkenylphenol ether, polyamine, aminophenol, amino acid hydrazine, cyanate ester, diallyl phthalate, triallyl isocyanurate, triallyl cyanurate, vinylic and/or styrene functional groups, preferably in amounts of 0.5 wt % to 50 wt %, preferably 1 wt % to 30 wt %, more preferably 5 wt % to 25 wt % based on the weight of component C.

For preferred allyl compounds of component C such comonomers can preferably be selected from the group comprised of monomers and/or oligomers and/or prepolymers from maleimide-, citraconimide-derivatives, polyamine, aminophenol, amino acid hydrazine, cyanate ester, vinylic and/or styrene functional groups, preferably in amounts of 0.5 wt % to 50 wt %, preferably 1 wt % to 30 wt %, more preferably 5 wt % to 25 wt % based on the weight of component C.

For preferred epoxy compounds of component C such comonomers can preferably be selected from the group comprised of monomers and/or oligomers and/or prepolymers from multifunctional alcohols or diols such as polyester diols, polybutadiene diols, polycarbonate diols and/or multifunctional amines such as Jeffamines and/or multifunctional anhydrides such as pyromellitic dianhydride, preferably in amounts of 0.5 wt % to 50 wt %, preferably 1 wt % to 30 wt %, more preferably 5 wt % to 25 wt % based on the weight of component C.

In some preferred embodiments, the inventive resin composition comprises at least one polymerization inhibitor, preferably an inhibitor selected from the group consisting of quinones such as hydroquinones and/or benzoquinones, phenothiazines, diethylhydroxylamine, 4-tert-butylcatechol, butylated hydroxytoluene, pyrogallol, TEMPO and/or 4-hydroxy-TEMPO, preferably in amounts of 0.001 wt % to 1 wt %, preferably 0.005 wt % to 0.5 wt %, more preferably 0.01 wt % to 0.1 wt % based on the total weight of components A-D.

In some preferred embodiments, the inventive resin composition comprises at least one light absorber such as a pigment or a dye, preferably a light absorber selected from the group consisting of inorganic particles such as titanium dioxide and/or carbon black and/or organic UV light absorbers such as benzophenone derivatives, benzotriazole derivatives, triazine derivatives, thioxanthones, hindered amine light-stabilizers such as Chimassorb, Tinuvin and/or Uvinul products, preferably in amounts of 0.001 wt % to 2 wt %, preferably 0.01 wt % to 1 wt %, more preferably 0.02 wt % to 0.5 wt % based on the total weight of components A-D.

The aforementioned photoinitiators, thermal initiators, catalysts, inhibitors, light absorbers and other additives may be of polymeric nature and/or additionally functionalized with a polymerizable functional group, which can either undergo polymerization with light-curable components A, B, D and/or heat-curable components C as it is in accordance with a preferred embodiment of the present invention.

In some preferred embodiments the inventive resin composition comprises additional toughness modifiers selected from the group consisting of thermoplastic resins. By way of example such thermoplastic resins could be polypropylene, polyethylene, polyamide, polyethylene oxide and/or polypropylene oxide, reactive rubbers, in particular butadiene-acrylonitrile copolymers and/or natural polymers such as cellulose and/or gelatin, such components are preferably terminated or functionalized with one or multiple reactive groups susceptible of radical or ionic polymerization (e.g., (meth)acrylate, (meth)acrylamide, vinyl esters, vinyl ether or styrene compounds, cyclic ethers such as epoxy compounds or oxetanes), and/or monomers comprising said reactive groups with flexible linkers, in particular long aliphatic chains and/or ethylene glycol spacers and/or a light-curable component B, preferably forming a polymerized network with an elongation at break >50% and a $T_g<0°$ C., preferably a $T_g$<−30° C. or, preferably in amounts of 0.5 wt % to 30 wt %, preferably 2 wt % to 15 wt %, more preferably 5 wt % to 10 wt % based on the total weight of components A-D.

In some preferred embodiments, the resin composition of this invention further contains additives, which bring upon better flame resistance, lower smoke toxicity or smoke formation. Such flame retardant or smoke suppressing additives are selected from the groups of substances known to the polymer industry. By way of example such flame retardant or smoke suppressing additives are inorganic fillers or mineral flame retardants such as aluminum hydroxide, magnesium hydroxide, calcium hydroxide, antimony oxide, tin oxide, borax and/or zinc borate, red phosphorous, expanded graphite, organic additives such as nitrogen donors and/or phosphorous containing substances (e.g., ammonium polyphosphate, melamine polyphosphate, organic phosphates, triphenyl phosphine, phosphinates, 9,10-dihydro-9-oxa-10-phosphaphenanthren-10-oxide), halogenated organic flame retardants such as halogenated phosphates, halogenated diphenylether, halogenated styrene, halogenated epoxides, halogenated (meth)acrylates and/or halogenated paraffins, preferably in amounts of 0.5 wt % to 50 wt %, preferably 1 wt % to 30 wt %, more preferably 2 wt % to 25 wt % based on the total weight of components A-D. In another preferred embodiment such organic, flame retardant additives are functionalized with a polymerizable group such as (meth)acrylate.

In some preferred embodiments, the resin composition of this invention comprises organic and/or inorganic fillers. Such mixtures are generally described as composites, preferably in amounts of 0.5 wt % to 50 wt %, preferably 1 wt % to 30 wt %, more preferably 2 wt % to 25 wt % based on the total weight of components A-D.

Preferred organic fillers may be but are not limited to core-shell particles, block copolymers, PTFE, high performance polymers, thermoplastics, in particular polyamides, polycarbonates, polystyrene, polyoxymethylene, poly(ether imides), polyethersulfones or polysulfones, rubbers, and the like.

Preferred inorganic fillers may be metals, metal oxides and/or ceramics (e.g., $SiO_2$, $ZrO_2$, $TiO_2$, ZnO or mixtures thereof with an average particle size of 1-100 μm, and/or preferred nano- or micro fillers with an average particle size of 10 nm-1000 nm), silicates such as talc, clays, silica and/or mica, glass powders (in particular quartz, glass ceramics as preferred nano- or micro fillers with an average particle size of 0.01-100 μm), carbon black, graphene, graphite. The average particle size of the fillers may be determined via static light scattering methods using the Mie-theory according to DIN/ISO 13320 for the determination of average particle size and particle size distribution. In a second aspect, such organic or inorganic fillers may be spheres, platelets and/or fibers (e.g., nanofibers, whiskers, and/or mixtures thereof, spheres, fractures and/or defined three-dimensional, in particular graphite and/or two-dimensional structures, in particular monolayers of graphene).

Preferably, the fillers may be modified on their surface (e.g., silanzied via radically polymerizable silanes such as 3-methacryloyloxypropyl trimethoxy silane). For the surface modification of inorganic fillers, such as $ZrO_2$ or $TiO_2$, functionalized, acidic phosphates (e.g., 10-methacryloyloxydecyldihydrogen phosphate) may be used. With such modifications, phenomena like agglomeration, mixture stability, particle bonding to the polymer matrix are controlled and/or influenced.

The resin composition of this invention may additionally comprise alone or in combination with each other the following components: stabilizers (such as UV-stabilizing agents or anti-aging agents), antioxidants, colorants (such as dyes or pigments), antibacterial agents, antistatic agents, softeners or plasticizers or lubricants, wetting agents, matting agents, adhesion promoters, rheology modifiers, thixotropic agents, dispersants, optical brighteners, opacifying agents, anti-foam agents and/or UV-absorbers.

The inventive resin composition may be cured to form any object, including a coating, an adhesive, a sealant, an ink, or cured in a layer-by-layer fashion to form a 3D-part preferably via a 3D-printing process such as stereolithography and subsequently post-cured via a secondary or multiple further heat-curing steps.

The herein disclosed mixtures of components A-D may be mixed in various ratios and additional components as described above. Preferable ratios for mixing the formulations may be:

At least one monofunctional component A according to formula I (light-curable reactive diluent): 5 wt % to 80 wt %, preferably from 10 wt % to 60 wt %, more preferably from 15 wt % to 55 wt % and even more preferably from 20 wt % to 45 wt % based on the total weight of components A, B, C and D At least one component B (light-curable toughness modifier, preferably an oligomer): 10 wt % to 90 wt %, preferably from 20 wt % to 80 wt %, more preferably from 25 wt % to 70 wt %, even more preferably from 30 wt % to 65 wt % based on the total weight of components A, B, C and D At least one component C (heat-curable $T_g$-enhancer): 1 wt % to 50 wt %, preferably from 2 wt % to 40 wt %, more preferably from 3 wt % to 30 wt %, even more preferably from 5 wt % to 25 wt % based on the total weight of components A, B, C and D At least one photoinitiator: 0.01-10 wt %, preferably 0.1 wt % to 7 wt %, more preferably 0.2-5 wt % based on the weight of components A, B and D Optionally, component D as a suitable comonomer, which copolymerizes with components A and B and acts as a crosslinking agent (CA) to yield better processability: 3 wt % to 70 wt %, preferably from 5 wt % to 60 wt %, more preferably from 7 wt % to 50 wt %, even more preferably from 10 wt % to 40 wt % based on the total weight of components B and D.

Optionally, a suitable curing agent for component C: 0.01 wt % to 20 wt %, preferably 0.1 wt % to 15 wt %, more preferably 0.2 wt % to 10 wt % based on the weight of component C.

The presence of the monofunctional reactive diluent (component A) provides for a cured material with reduced crosslinking density resulting in higher toughness (e.g., measured by elongation at break), yet maintained heat resistance due to a rigid polymer backbone preferably originating from substituents such as aromatic or cyclic groups, which are responsible for forming a polymer backbone preferably with a $T_g$>40° C., even more preferably with a $T_g$>100° C.

The presence of the multifunctional, light-curable component B as toughness modifier having a molecular weight of >500 g mol$^{-1}$, preferably >1000 g mol$^{-1}$ is responsible for forming a polymerized network with improved toughness (e.g., increased elongation at break).

Components A and B are responsible for the light-triggered structuring step and are selected to provide sufficient green strength and 3D-structuring of the formulations, preferably via Hot Lithography using temperatures in the build-up step of 30 to 150° C. Optionally, the presence of the crosslinking component D further improves the green strength and 3D-structuring of the formulations, preferably via Hot Lithography using temperatures in the build-up step of 30 to 150° C. The photopolymer formed after the light-curing step is characterized as a tough photopolymer preferably exhibiting a $T_g$>25° C. and an elongation at break >10%.

The presence of the multifunctional, heat-curable component C is responsible for forming preferentially a second polymerized network with a $T_g$>100° C., thus provides for an improved heat resistance (e.g., measured by $T_g$) of the final photopolymer network while maintaining toughness (e.g., measured by elongation at break). Optionally, component C can also be light-curable via a different curing mechanism (e.g., cationic vs radical curing) or light-curable at a different wavelength (e.g., radical curing at wavelengths>390 nm and cationic curing at wavelengths<380 nm).

Preferably, the resin composition at room temperature (20° C.) has a viscosity >5 Pa s. These viscosities result from the particularly high content of component B which provides a remarkably high toughness of the materials formed from the inventive resin composition, due to its high molecular weight. High resin viscosities can also result from components C with high softening or melting temperatures, which are particularly prone to form secondary networks with a high $T_g$.

According to a further aspect, the invention relates to a method of manufacturing an object from the inventive resin composition, wherein the resin composition is subjected to a light-induced structuring step followed by a heat-induced curing step. In a preferred embodiment the light-induced structuring step is followed by a light-induced post-curing step. As will be apparent to one skilled in the art, the curing process via light may be an additive manufacturing process, more preferably a 3D printing process with the respective thermal post-processing steps to obtain the final product having the desired chemical, mechanical and thermal properties. The inventive resin formulations may thus be used as resin formulations for making 3D-objects via additive manufacturing. Resulting 3D-parts offer exceptional balance of glass transition temperature and heat resistance, while exhibiting high toughness. Possible applications for such additively manufactured 3D-objects from said materials may be jigs and fixtures, automotive parts (e.g., housings and interior facings, parts in contact with fuel such as connectors), electronic connectors, parts for printed circuit boards, packaging and cooling architectures for electronics, chip mounting, robotic hands, battery storage enclosures, healthcare applications (e.g., parts exposed to high temperature for sterilization), surgical instruments (e.g., retractors, dilators, dissectors), intraoral devices such as surgical guides for dental applications or other examples where there is a demand for mechanical durability and thermal stability at temperatures>50° C.

According to a preferred embodiment of the method, the light-induced structuring step is carried out utilizing an NIR- or UV/Vis light source and corresponding optics, wherein the NIR-configuration is selected to enable 3D-fabrication via two photon photopolymerization and the UV/Vis configuration is selected from the group consisting of laser/DLP, LED/DLP, laser/LCD, and LED/LCD.

Typically, formulations with a viscosity below 1 Pa s at ambient conditions or slightly higher temperatures of <35° C. are required for conventional L-AMTs and temperatures above 35° C. are rarely reached nor suitable. For resin viscosities higher than 1 Pa s at temperatures higher than 35° C., L-AMTs for highly viscous resins at elevated temperatures (e.g., Hot Lithography) become the printing processes of choice.

In a preferred embodiment, the light-induced structuring step is carried out at elevated processing temperatures of the resin composition, preferably at a temperature between 35° C. and 120° C., more preferably between 40° C. and 100° C., even more preferably between 40° C. and 90° C. This is done in order to provide processability for a high content of the component B with high molecular weight and components C with high softening or melting temperatures to reduce the viscosity of the inventive resin composition during the structuring step.

In a preferred embodiment, a layer of the resin composition is formed on a carrier plate, e.g., by means of a recoater blade, the resin composition preferably having a viscosity at said processing temperature of 0.01 to 70 Pa s, preferably of 0.1 to 30 Pa s, the layer being formed preferably having a thickness of less than 2 mm, more preferably less than 1 mm, even more preferably less than 0.8 mm.

The light-induced structuring step is preferably performed for building an object by 3D-printing, wherein layers of said object are formed one after the other and one on top of each other by each forming a material layer of predetermined thickness of the resin composition between a transparent or at least partially transparent carrier such as a plate, a carrier film or a bottom of a vat, and a mechanically adjustable construction platform, or the object at least partially formed on the construction platform and wherein the so defined material layer is cured in a position-selective manner, in particular by irradiation through the transparent or at least partially transparent carrier, to provide the desired shape of the layer.

According to a preferred embodiment, the light-induced structuring step is carried out by using a first radiation source, wherein the radiation of the first radiation source is applied to the resin composition through the transparent carrier plate, and heating of the layer of resin composition to be structured is carried out by using a second radiation source, wherein the carrier plate is essentially impermeable for the radiation of the second radiation source. In this way, the carrier plate is heated by the radiation of the second radiation source, said radiation essentially not entering into the layer of the resin composition, and resin composition thus indirectly heated via the carrier plate is structured by the radiation of the first radiation source. In particular, the heat-curable component C is not thermally cured by said second radiation source.

In a preferred embodiment, a layer of the resin composition is formed on a carrier plate (e.g., by means of a recoater blade) and the layer is being cured via the first light-curing step, wherein the thickness of the formed layer is greater than 10 μm, preferred greater than 25 μm, more preferred greater than 50 μm and even more preferred greater than 80 μm, and smaller than 1000 μm, preferred smaller than 800 μm, more preferred smaller than 500 μm and even more preferred smaller than 400 μm, and the curing thickness comes down to >1.1 times the layer height of the 3D-printing process.

In a preferred embodiment an object is produced from the inventive resin composition, wherein the light-induced structuring step is an additive manufacturing process and/or 3D-printing process, preferably stereolithography, digital light processing, material jetting or inkjet printing, more preferably based on the Hot Lithography technology.

After the light-curing step of the inventive resin has been performed, a heat-curing step is performed to yield further cure. The heating step may be performed within a temperature range of 100-300° C., preferably within a temperature range of 100-250° C. and may be divided into one or more individual curing steps with defined time intervals at respectively defined temperatures and defined heating rates (e.g., 10 K min$^{-1}$). Non-limiting examples for such heat-curing steps could be:

Method A→10 h at 160° C.,
Method B→0.5 h at 170° C. and 2 h at 150° C.,
Method C→0.5 h at 200° C. and 10 h at 160° C.,
Method D→2 h at 120° C. and 2 h at 150° C.

In a preferred embodiment, said heat-induced curing step is performed subsequently to the light-structuring 3D-printing step, wherein the shaped 3D-objects are cured at a temperature higher than the initial processing temperature of the light-structuring step, preferably at >100° C., more preferably >120° C., even more preferably >140° C. and at a temperature where the formed material still exhibits sufficient thermal stability, preferably <250° C., more preferably <200° C., even more preferably <180° C.

In a preferred embodiment the heat-induced curing step is performed subsequently to the light-structuring 3D-printing step, wherein the shaped 3D-objects are cured at a temperature higher than the initial processing temperature of the light-structuring step and the heat is applied directly via active heating in an oven (e.g., electric, gas or solar oven) or indirectly via microwave irradiation, other light impulses (such as infra-red light) or secondary exothermic reactions such as thermal polymerization and/or combinations thereof.

In a preferred embodiment a cured material is formed, which is
i) an interpenetrating polymer network; or
ii) a semi-interpenetrating polymer network; or
iii) a sequential interpenetrating polymer network; or
iv) a polymer blend.

The inventive material and/or object that results from subjecting the inventive resin composition to a light-induced structuring step followed by a heat-induced curing step is preferably characterized in that the object exhibits the following material properties:
i) a tensile modulus of 800 MPa or more, a tensile strength of 25 MPa or more, an elongation at break of 20% or more, a glass transition temperature of 45° C. or more and a temperature value at 1 GPa storage modulus of 30° C. or more; or
ii) a tensile modulus of 1500 MPa or more, a tensile strength of 35 MPa or more, an elongation at break of 5% or more, a glass transition temperature of 90° C. or more and a temperature value at 1 GPa storage modulus of 45° C. or more; or
iii) a tensile modulus of 2000 MPa or more, a tensile strength of 50 MPa or more, an elongation at break of 5% or more, a glass transition temperature of 100° C. or more and a temperature value at 1 GPa storage modulus of 60° C. or more; or
iv) a tensile modulus of 1300 MPa or more, a tensile strength of 35 MPa or more, an elongation at break of 20% or more, and a heat deflection temperature of 70° C. or more; or
v) a tensile modulus of 2000 MPa or more, a tensile strength of 55 MPa or more, an elongation at break of 10% or more, and a heat deflection temperature of 85° C. or more.

As used herein, the term "polymer" refers to a molecule composed of repeating structural units connected by covalent chemical bonds and characterized by a substantial number of repeating units (e.g., equal to or greater than 10 repeating units and often equal to or greater than 50 repeating units and often equal to or greater than 100 repeating units) and a high molecular weight (e.g., greater than or equal to 5000 Da, 10000 Da or 20000 Da). Polymers are commonly the polymerization product of one or more monomer precursors. The term "polymer" includes homopolymers, or polymers consisting essentially of a single repeating monomer subunit. The term "polymer" also includes copolymers which are formed when two or more different types of monomers are linked in the same polymer. Copolymers may comprise two or more monomer subunits, and include random, block, alternating, segmented, grafted, tapered and other copolymers.

As used herein, an "oligomer" refers to a molecule composed of repeating structural units connected by covalent chemical bonds and characterized by a number of repeating units less than that of a polymer (e.g., equal to or less than 10 repeating units) and a lower molecular weight than polymers (e.g., less than 20,000 Da or 10,000 Da). Oligomers may be the polymerization product of one or more monomer precursors. In an embodiment, an oligomer or a monomer cannot be considered a polymer in its own right.

A "prepolymer" refers to a polymer or oligomer, the molecules of which are capable of entering, through reactive groups, into further polymerization.

Oligomers and polymer mixtures may additionally form crosslinks, thus create polymer networks.

Oligomers and polymer mixtures can be characterized and differentiated from other mixtures of oligomers and polymers by measurements of molecular weight and molecular weight distributions.

As used herein, the term "molecular weight" refers to the number average molecular weight as measured by gel permeation chromatography (GPC) or size exclusion chromatography (SEC) calibrated with polystyrene standards in a suitable solvent (typically tetrahydrofuran).

EXAMPLES

The embodiments disclosed in the present invention are described in more detail by reference to the following non-limiting examples. These examples are presented for the purpose of illustration only and shall not be construed as limiting the scope of the invention as defined by the appended claims.

All chemicals used herein were purchased from commercial sources and used without further purification.

Curable compositions according to the present invention were prepared by mixing the respective compounds in a beaker with an anchor agitator from IKA or a speed mixer DAC 150 FVZ from Hauschild Engineering at a temperature of 30-60° C. The resins were mixed until they became homogeneous formulations.

Photorheology experiments were performed using an LED-coupling on an MCR 102 rheometer from Anton Paar, which allows for mimicking the irradiation conditions of the commercial Hot Lithography printer Caligma 200. An LX500 LED spot source from OmniCure with an LED wavelength of 400 nm was used and the output intensity was set to ~45 mW cm$^{-2}$. All samples were measured in oscillation mode (PP-10, frequency of 10 Hz, amplitude of 0.1%, temperature set to 30° C., measurement gap of 0.1 mm) and after an initial measurement step of 30 s the samples were irradiated for 300 s.

Further rheological measurements for exemplary materials were performed on the MCR 102 rheometer. The experiments for the assessment of onset of thermal polymerization were measured in oscillation mode (PP-10, frequency of 1 Hz, amplitude of 0.5%, temperature program 100-200° C. with a heating rate of 2 K min$^{-1}$, measurement gap of 0.5 mm). For the evaluation of resin viscosities, the respective resin formulations were measured in rotation mode (PP-25, shear rate of 50 s$^{-1}$, temperature program 25-70° C. with a heating rate of 2 K min$^{-1}$, measurement gap of 1 mm).

(Thermo)mechanical test specimens of the final materials according to the present invention were fabricated from the exemplary resin compositions via Hot Lithography technology from the company Cubicure GmbH on a developmental Caligma DLP printer (365 nm LED, for CE1-6.3, E1-6.3, E13-14 and E17-19) and on a commercial Caligma 200 printer (405 nm diode laser, for CE7, E7-12, E15-16 and E20-23). All printer parts in contact with the formulations (i.e., material vat, recoating unit, recoating blade and building platform) were heated to a temperature in the range of 30° C. to 60° C., depending on the adjusted printing temperature for each formulation. All 3D-parts fabricated on a Caligma DLP were printed with a light output intensity of ~45 mW cm$^{-2}$, a layer thickness of 100 µm (25 µm for E6.3) and an irradiation time of ~0.8 s (for CE4-5, E4-5, CE6.1-6.3, E6.1, E6.3, E13-14 and E17-19), ~1.6 s (for CE1-3 and E1-3) and ~2.4 s (for E6.2). The pixel size was set to ~50 µm on the upper surface of the material vat. All 3D-parts printed on a Caligma 200 were structured with a laser scan speed of 12000 mm s$^{-1}$, a laser intensity of 170 mW and a layer thickness of 100 µm. The hatching distance was set to 15 µm in one direction and the laser spot had a diameter of ~20 µm (FWHM) on the upper surface of the material vat. 1 repetition of laser irradiation per layer was performed, indicating a high reactivity of the respective resin formulations.

After each print job the 3D-printed specimens were mechanically detached from the building platform with a blade and excess resin was removed from the parts with a wipe and/or via solvent cleaning with isopropanol. A UV-post curing step was performed with all 3D-printed specimens in a Uvitron IntelliRay 600 at 100% intensity (~150 mW cm$^{-2}$, ~280-550 nm broadband) for 2×5 min and samples were flipped in between exposure cycles to ensure the light-curing step was completed. The thermal post-processing (second network forming step) was conducted in a Heratherm OMH60 oven from Thermo Scientific with a temperature protocol according to listed methods (heating rate set to 10 K min$^{-1}$):

Method A→10 h at 160° C. for CE1-3, E1-3, CE6.2-6.3 and E6.2-6.3
Method B→0.5 h at 170° C. and 2 h at 150° C. for CE4-5 and E4-5
Method C→0.5 h at 200° C. and 10 h at 160° C. for CE6.1 and E6.1
Method D→2 h at 120° C. and 2 h at 150° C. for CE7 and E7-23

A ProLine Z010 TH material tester from Zwick/Roell was used for tensile tests of the 3D-printed specimens. The test was performed according to DIN EN ISO 527 using 5A specimens. The tensile modulus was measured within 0.05-0.25% of elongation at a strain rate of 1 mm min$^{-1}$ and then the measurement was continued with a strain rate of 10 mm min$^{-1}$.

DMA measurements to evaluate the storage modulus plots and glass transition temperature $T_g$ were performed on a Dynamic Mechanical Analyzer (DMA 8000 by Perkin Elmer) with a set temperature program (30° C. to 200° C.) and a heating rate of 2 K min$^{-1}$. Samples with a box geometry of 25×4×2 mm$^3$ were measured in 3-point-bending mode. The testing conditions were set to a frequency of 1 Hz, a strain of 50 µm and a preload force of 0 N. The glass transition temperature $T_g$ is derived from the maximum value of the loss factor plot (tan δ).

Heat Deflection Temperature (HDT) measurements were performed on an HDT/Vicat 3-300 standard. HDT(B) tests were performed according to DIN EN ISO 75. The sample specimens (with a rectangular geometry of 80×10×4 mm$^3$) were tested flatwise with a loading force of 0.45 MPa for HDT(B). The starting temperature for each measurement was set to 26° C. and the samples were subjected to the respective loading force for 5 min. Then, a temperature ramp of 120 K min$^{-1}$ was performed.

Preliminary Tests

Low photoreactivity for heat-curable components C was verified using an LED-coupling on the MCR 102 rheometer, which allows for mimicking the irradiation conditions of the commercial Hot Lithography printer Caligma 200. It is evident from FIG. 4 that light-curable resins, such as comparative example 3 (CE3) show sufficient light-curability to support 3D-structuring on a Caligma printer (gelation in less than 3 s), while heat-curable components C such as allyl compounds TAIC or DAP show very low to no reactivity upon light exposure (gelation >than 10 s and outside the light output set on the Caligma DLP or Caligma 200 printers during 3D-structuring). This renders those components C unreactive during the 3D-structuring step, being the light-curing step, via the set light impulse on Caligma printers.

Furthermore, exemplary heat-curable components C used within the disclosed examples and combined with an example of their respective thermal initiators or catalysts (triallyl isocyanurate TAIC, diallyl phthalate DAP and an oligomer of 1,3-bis(citraconimidomethyl)benzene OBCI with 0.5 phr dicumyl peroxide, respectively; 4,4'-bismaleimidodiphenylmethane BMIDPM with 2 phr 2-ethy-4-methyl imidazole; multifunctional epoxy resin bisphenol A diglycidyl ether BADGE with 5 phr dicyandiamide) were characterized with respect to their onset temperature for thermal polymerization. All samples were measured on an MCR 102 rheometer in oscillation mode within a temperature range of 100-200° C. It is required of said heat-curable components C to exhibit good storage stability at ambient conditions and further exhibit thermal stability at typical processing temperatures for Hot Lithography printing being from 30-120° C. Preferably, the onset of thermal curing for heat-curable components C lies within the temperature window of 120-200° C. All evaluated examples of component C show good storage stability at ambient conditions (at least >3 months), which is also confirmed by the respective raw material suppliers. Furthermore, thermal curing of respective components C is confirmed within a temperature range of 120-200° C. (see FIG. 5), which is beneficial for thermal post-processing of the inventive 3D-photopolymer parts. The allyl-based (TAIC with ~145° C. and DAP with ~165° C.) and imide-based components C (OBCI with ~140° C. and BMIDPM with ~155° C.) exhibit more favorable thermal initiation temperatures in the range of 140-180° C. compared to the epoxy-based component BADGE with an onset slightly above 190° C. However, this onset temperature for epoxy-based components can be adjusted to fall into the preferred temperature range of 140-180° C. with alternative, state-of-the-art curing agents as described in the present disclosure and this constitutes a method known to the expert in the field.

Examples 1-3

Examples 1-3 being examples of the inventive resin composition are composed of light-curable components A and B in combination with a heat-curable component C; Comparative Examples 1-3 make up respective light-curable resin compositions comprising components A and B (for CE3) and optionally a crosslinking component D instead of a heat-curable component C (for CE1-2).

TABLE 1

Formulation compositions for comparative examples 1-3 (CE1-3) and examples 1-3 (E1-3)

| Components | E1 (wt %) | E2 (wt %) | E3 (wt %) | E1 (wt %) | E2 (wt %) | E3 (wt %) |
|---|---|---|---|---|---|---|
| Monofunctional methacrylate (isobornyl methacrylate, component A as RD) | 27 | 27 | 30 | 27 | 27 | 28.5 |
| Multifunctional acrylate (difunctional aliphatic urethane acrylate Ebecryl 8811, component B as TNM) | 63 | 63 | 70 | 63 | 63 | 66.5 |
| Multifunctional methacrylate (bisphenol A-glycidyl dimethacrylate, component D as CA) | 10 | — | — | — | — | — |
| Multifunctional acrylate (tris(2-hydroxy ethyl)isocyanurate triacrylate, component D as CA) | — | 10 | — | — | — | — |
| Multifunctional allyl compound (diallyl phthalate, component C as TGE) | — | — | — | 10 | — | — |
| Multifunctional allyl compound (triallyl isocyanurate, component C as TGE) | — | — | — | — | 10 | 5 |

Preparation of Resin Formulations

CE1: 18.9 g of the monofunctional, light-curable component A, being isobornyl methacrylate as RD, 44.1 g of the light-curable component B, being the difunctional aliphatic urethane acrylate Ebecryl 8811 as TNM, and 7 g of the multifunctional crosslinking component D, being bisphenol A-glycidyl dimethacrylate as CA, were homogenized together with 0.7 g (1 phr) of the photoinitiator ethyl (2,4,6-trimethylbenzoyl) phenyl phosphinate (TPO-L) and 0.35 g (0.5 phr) of the thermal initiator dicumyl peroxide (DCP).

CE2: 18.9 g of the monofunctional, light-curable component A, being isobornyl methacrylate as RD, 44.1 g of the light-curable component B, being the difunctional aliphatic urethane acrylate Ebecryl 8811 as TNM, and 7 g of the multifunctional crosslinking component D, being tris(2-hydroxy ethyl)isocyanurate triacrylate as CA, were homogenized with 0.7 g (1 phr) of the photoinitiator ethyl (2,4,6-trimethylbenzoyl) phenyl phosphinate (TPO-L) and 0.35 g (0.5 phr) of the thermal initiator dicumyl peroxide (DCP).

CE3: 21 g of the monofunctional, light-curable component A, being isobornyl methacrylate as RD, and 49 g of the light-curable component B, being the difunctional aliphatic urethane acrylate Ebecryl 8811 as TNM, were homogenized together with 0.7 g (1 phr) of the photoinitiator ethyl (2,4,6-trimethylbenzoyl) phenyl phosphinate (TPO-L) and 0.35 g (0.5 phr) of the thermal initiator dicumyl peroxide (DCP).

E1: 18.9 g of the monofunctional, light-curable component A, being isobornyl methacrylate as RD, 44.1 g of the light-curable component B, being the difunctional aliphatic urethane acrylate Ebecryl 8811 as TNM, and 7 g of the heat-curable component C, being diallyl phthalate as TGE, were homogenized together with 0.7 g (1 phr) of the photoinitiator ethyl (2,4,6-trimethylbenzoyl) phenyl phosphinate (TPO-L) and 0.35 g (0.5 phr) of the thermal initiator dicumyl peroxide (DCP).

E2: 18.9 g of the monofunctional, light-curable component A, being isobornyl methacrylate as RD, 44.1 g of the light-curable component B, being the difunctional aliphatic urethane acrylate Ebecryl 8811 as TNM, and 7 g of the heat-curable component C, being triallyl isocyanurate as TGE, were homogenized together with 0.7 g (1 phr) of the photoinitiator ethyl (2,4,6-trimethylbenzoyl) phenyl phosphinate (TPO-L) and 0.35 g (0.5 phr) of the thermal initiator dicumyl peroxide (DCP).

E3: 19.95 g of the monofunctional, light-curable component A, being isobornyl methacrylate as RD, 46.55 g of the light-curable component B, being the difunctional aliphatic urethane acrylate Ebecryl 8811 as TNM, and 3.5 g of the heat-curable component C, being triallyl isocyanurate as TGE, were homogenized together with 0.7 g (1 phr) of the photoinitiator ethyl (2,4,6-trimethylbenzoyl) phenyl phosphinate (TPO-L) and 0.35 g (0.5 phr) of the thermal initiator dicumyl peroxide (DCP).

TABLE 2

Results for comparative examples 1-3 (CE1-3) and examples 1-3 (E1-3)

| Property | CE1 | CE2 | CE3 | E1 | E2 | E3 |
|---|---|---|---|---|---|---|
| Viscosity of formulation (Pa s) at 30/45/60° C. | 16.43 / 4.67 / 1.49 | 12.80 / 3.91 / 1.32 | 10.48 / 3.87 / 1.34 | 5.18 / 1.79 / 0.68 | 6.30 / 2.41 / 0.86 | 7.27 / 2.79 / 1.00 |
| Tensile modulus (MPa) | 1590 (±50) | 1450 (±50) | 1140 (±50) | 1260 (±50) | 1400 (±50) | 1510 (±50) |
| Tensile strength (MPa) | 40 (±1) | 36 (±1) | 26 (±1) | 32 (±1) | 37 (±1) | 35 (±1) |
| Elongation at break (%) | 30 (±9) | 37 (±2) | 59 (±3) | 48 (±5) | 35 (±6) | 44 (±5) |

TABLE 2-continued

Results for comparative examples 1-3 (CE1-3) and examples 1-3 (E1-3)

| Property | CE1 | CE2 | CE3 | E1 | E2 | E3 |
|---|---|---|---|---|---|---|
| $T_{1\ GPa}$ (° C.) | 50 | 48 | 34 | 45 | 50 | 41 |
| $T_{0.5\ GPa}$ (° C.) | 58 | 55 | 43 | 52 | 57 | 50 |
| $T_g$ (° C.) | 87 | 78 | 67 | 80 | 92 | 82 |

$T_{1\ GPa}$: temperature at which storage modulus G' reaches 1 GPa
$T_{0.5\ GPa}$: temperature at which storage modulus G' reaches 0.5 GPa
$T_g$: glass transition temperature recorded at maximum of tanδ

Discussion

When formulating a heat-curable component C as TGE into a light-curable matrix an increase in strength, modulus and $T_g$ is expected, while maintaining toughness (e.g., elongation at break) or significantly outperforming equivalent components (e.g., crosslinking components D) that are also rendered light-curable and do not support the formation of a secondary network. Example E1 leads to significantly improved strength (+23%), modulus (+10%) and thermal properties (+20%) compared to comparative example CE3, which is only comprised of components A and B, while elongation at break is compromised by only ~19% (Table 2 and FIGS. 6a and 6b). Yet, comparative example CE1 shows a much higher degree of stiffening with increased strength (+54%), modulus (+39%) and thermal properties (+30%) compared to CE3, while elongation at break is severely compromised by as much as 50%. It is evident that example E1 outperforms comparative example CE1 by improving overall thermal properties without having to strongly sacrifice toughness measured by elongation at break (+20% thermal and −19% toughness for E1 over +30% thermal and −50% toughness for CE1, see FIG. 6b). This is a first strong indication for the higher performance of the hybrid resin systems, yet the comparison of DAP as component C in E1 and bisphenol A-glycidyl dimethacrylate as component D in CE1 is not ideal as bisphenol A-glycidyl dimethacrylate comprises significantly more aromatic moieties in between crosslinks, which is responsible for the higher overall strength and thermal performance in comparison to E1.

Example E2 leads to significantly improved strength (+42%), modulus (+23%) and thermal properties (+37%) compared to comparative example CE3, which is only comprised of components A and B, while elongation at break is compromised by ~40% (Table 2 and FIGS. 6c and 6d). Measuring comparative example CE2 with CE3 a rather similar degree of stiffening with increased strength (+38%) and modulus (+27%), yet much lower improvement of thermal properties (only +16%) compared to E2 vs CE3 is recorded. Further comparing CE2 with CE3, elongation at break is similarly compromised by as much as ~40%. It is evident that example E2 outperforms comparative example CE2 by improving overall thermal properties without having to strongly sacrifice toughness measured by elongation at break (+37% thermal and −40% toughness for E2 over +16% thermal and −40% toughness for CE1, see FIG. 6d).

When directly comparing the second example E2 and comparative example CE2 a more ideal comparison can be performed, as heat-curable component C in E2, being triallyl isocyanurate as TGE, has a very similar molecular structure compared to the light-curable, crosslinking component D in CE2, being tris(2-hydroxy ethyl)isocyanurate triacrylate as CA. As can be derived from the resulting data, E2 and CE2 show almost identical mechanical performance (less than 5% deviation for E2 vs CE2), yet E2 shows much improved thermal properties (+18% compared to CE2), which is highly beneficial in terms of potential applications for the inventive material systems (Table 2 and FIGS. 6c and 6d). Also, when the content of heat-curable component C is reduced by a factor of 2, as shown with E3, the impact on thermal performance is still evident (higher $T_g$ compared to CE2, yet reduced modulus over temperature) and elongation at break is maintained high at +18% over CE2 (Table 2 and FIG. 6c).

Examples 4-5

Examples 4-5 being examples of the inventive resin composition are composed of light-curable components A, B and D in combination with a heat-curable component C; Comparative Examples 4-5 make up respective light-curable resin compositions comprising components A, B, D and additional crosslinking component D making up for heat-curable component C with respect to examples 4-5.

TABLE 3

Formulation compositions for comparative examples 4-5 (CE4-5) and examples 4-5 (E4-5)

| Components | CE4 (wt %) | E4 (wt %) | CE5 (wt %) | E5 (wt %) |
|---|---|---|---|---|
| Monofunctional methacrylate (isobornyl methacrylate, component A as RD) | 25 | 25 | 25 | 25 |
| Multifunctional acrylate (difunctional aliphatic urethane acrylate Ebecryl 8811, component B as TNM) | 45 | 45 | — | — |
| Multifunctional methacrylate (difunctional polyether urethane methacrylate, component B as TNM) | — | — | 45 | 45 |
| Multifunctional acrylate (tris(2-hydroxy ethyl)isocyanurate triacrylate, component D as CA) | 30 | 15 | 30 | 15 |
| Multifunctional allyl compound (triallyl isocyanurate, component C as TGE) | — | 15 | — | 15 |

Preparation of Resin Formulations

CE4: 25 g of the monofunctional, light-curable component A, being isobornyl methacrylate as RD, 45 g of the light-curable component B, being the difunctional aliphatic urethane acrylate Ebecryl 8811 as TNM, and 30 g of the multifunctional crosslinking component D, being tris(2-hydroxy ethyl)isocyanurate triacrylate as CA, were homogenized together with 2 g (2 phr) of the photoinitiator ethyl (2,4,6-trimethylbenzoyl) phenyl phosphinate (TPO-L) and 0.5 g (0.5 phr) of the thermal initiator dicumyl peroxide (DCP).

CE5: 25 g of the monofunctional, light-curable component A, being isobornyl methacrylate as RD, 45 g of the light-curable component B, being a difunctional polyether urethane methacrylate as TNM, and 30 g of the multifunctional crosslinking component D, being tris(2-hydroxy ethyl)isocyanurate triacrylate as CA, were homogenized together with 2 g (2 phr) of the photoinitiator ethyl (2,4,6-trimethylbenzoyl) phenyl phosphinate (TPO-L) and 0.5 g (0.5 phr) of the thermal initiator dicumyl peroxide (DCP).

E4: 25 g of the monofunctional, light-curable component A, being isobornyl methacrylate as RD, 45 g of the light-curable component B, being the difunctional aliphatic urethane acrylate Ebecryl 8811 as TNM, 15 g of the multifunctional crosslinking component D, being tris(2-hydroxy ethyl)isocyanurate triacrylate as CA, and 15 g of the heat-curable component C, being triallyl isocyanurate as TGE, were homogenized together with 2 g (2 phr) of the photoinitiator ethyl (2,4,6-trimethylbenzoyl) phenyl phosphinate (TPO-L) and 0.5 g (0.5 phr) of the thermal initiator dicumyl peroxide (DCP).

E5: 25 g of the monofunctional, light-curable component A, being isobornyl methacrylate as RD, 45 g of the light-curable component B, being a difunctional polyether urethane methacrylate as TNM, 15 g of the multifunctional crosslinking component D, being tris(2-hydroxy ethyl)isocyanurate triacrylate as CA, and 15 g of the heat-curable component C, being triallyl isocyanurate as TGE, were homogenized together with 2 g (2 phr) of the photoinitiator ethyl (2,4,6-trimethylbenzoyl) phenyl phosphinate (TPO-L) and 0.5 g (0.5 phr) of the thermal initiator dicumyl peroxide (DCP).

TABLE 4

Results for comparative examples 4-5
(CE4-5) and examples 4-5 (E4-5)

| Property | CE4 | E4 | CE5 | E5 |
|---|---|---|---|---|
| Viscosity of formulation (Pa s) at 30/45/60° C. | 6.87<br>2.46<br>0.84 | 4.73<br>1.46<br>0.52 | 4.68<br>1.68<br>0.59 | 3.05<br>1.01<br>0.37 |
| Tensile modulus (MPa) | 2310<br>(±100) | 2190<br>(±100) | 2660<br>(±100) | 2730<br>(±100) |
| Tensile strength (MPa) | 59<br>(±1) | 59<br>(±1) | 68<br>(±1) | 66<br>(±1) |
| Elongation at break (%) | 14<br>(±4) | 13<br>(±2) | 10<br>(±2) | 11<br>(±4) |
| $T_{2\ GPa}$ (° C.) | 42 | 45 | 52 | 54 |
| $T_{1\ GPa}$ (° C.) | 69 | 76 | 79 | 86 |
| $T_{0.5\ GPa}$ (° C.) | 86 | 94 | 94 | 104 |
| $T_g$ (° C.) | 110 | 118 | 124 | 128 |

$T_{2\ GPa}$: temperature at which storage modulus G' reaches 2 GPa
$T_{1\ GPa}$: temperature at which storage modulus G' reaches 1 GPa
$T_{0.5\ GPa}$: temperature at which storage modulus G' reaches 0.5 GPa
$T_g$: glass transition temperature recorded at maximum of tanδ

Discussion

Examples E4 and E5 significantly outperform their comparative counterparts CE4 and CE5 in terms of thermal performance (e.g., modulus over temperature and $T_g$—see FIGS. 7a and 7b), yet the materials E4 and E5 show almost identical mechanical performance compared to CE4 and CE5, respectively (see tensile test results in Table 4). Both examples are comprising the heat-curable component C, being triallyl isocyanurate as TGE, in place of the light-curable component D, being tris(2-hydroxy ethyl)isocyanurate triacrylate as CA, which is represented in an equivalent amount in CE4 and CE5 respectively. Again, it is proven that the heat-curable component C significantly impacts thermal performance acting as TGE, while having a comparatively lower negative impact on toughness measured by elongation at break as experienced in comparative examples.

Examples 6.1-6.3

Examples 6.1-6.3 being examples of the inventive resin composition are composed of light-curable components A and B in combination with a heat-curable component C; Comparative Examples 6.1-6.2, made up from the same resin composition, yet post-processed via different methods (Method C for CE6.1 and Method A for CE6.2), make up respective light-curable resin compositions comprising components A, B and a crosslinking component D instead of a heat-curable component C; Comparative Example 6.3 is composed of a respective light-curable resin composition comprising components A and B.

TABLE 5

Formulation compositions for comparative examples
6.1-6.3 (CE6.1-6.3) and examples 6.1-6.3 (E6.1-6.3)

| Components | CE6.1/<br>CE6.2<br>(wt %) | E6.1<br>(wt %) | CE6.3<br>(wt %) | E6.2<br>(wt %) | E6.3<br>(wt %) |
|---|---|---|---|---|---|
| Monofunctional acrylamide (N-acryloyl morpholine, component A as RD) | 27 | 27 | 30 | 27 | 27 |
| Multifunctional acrylate (difunctional aliphatic urethane acrylate Ebecryl 8811, component B as TNM) | 63 | 63 | 70 | 63 | 63 |
| Multifunctional acrylate (tris(2-hydroxy ethyl)isocyanurate triacrylate, component D as CA) | 10 | — | — | — | — |
| Multifunctional epoxy resin (bisphenol A diglycidyl ether BADGE, component C as TGE) | — | 10 | — | — | — |
| Multifunctional citraconimide (oligomer of 1,3-bis(citraconimidomethyl)benzene OBCI, component C as TGE) | — | — | — | 10 | — |
| Multifunctional maleimide (4,4'-bismaleimidodiphenylmethane BMIDPM, component C as TGE) | — | — | — | — | 10 |

Preparation of Resin Formulations

CE6.1 and CE 6.2: 27 g of the monofunctional, light-curable component A, being N-acryloyl morpholine as RD, 63 g of the light-curable component B, being the difunctional aliphatic urethane acrylate Ebecryl 8811 as TNM, and 10 g of the multifunctional crosslinking component D, being tris(2-hydroxy ethyl)isocyanurate triacrylate as CA, were homogenized together with 1 g (1 phr) of the photoinitiator ethyl (2,4,6-trimethylbenzoyl) phenyl phosphinate (TPO-L) and 0.5 g (0.5 phr) of the thermal initiator dicumyl peroxide (DCP).

CE6.3: 30 g of the monofunctional, light-curable component A, being N-acryloyl morpholine as RD, and 70 g of the light-curable component B, being the difunctional aliphatic urethane acrylate Ebecryl 8811 as TNM were homogenized together with 1 g (1 phr) of the photoinitiator ethyl (2,4,6-trimethylbenzoyl) phenyl phosphinate (TPO-L) and 0.5 g (0.5 phr) of the thermal initiator dicumyl peroxide (DCP).

E6.1: 27 g of the monofunctional, light-curable component A, being N-acryloyl morpholine as RD, 63 g of the light-curable component B, being the difunctional aliphatic urethane acrylate Ebecryl 8811 as TNM, and 10 g of the heat-curable component C, being the multifunctional epoxy resin bisphenol A diglycidyl ether (BADGE) as TGE, were homogenized together with 1 g (1 phr) of the photoinitiator ethyl (2,4,6-trimethylbenzoyl) phenyl phosphinate (TPO-L), 0.5 g (0.5 phr) of the thermal initiator dicumyl peroxide (DCP) and 0.5 g (5 phr with respect to the weight content of BADGE) of the latent thermal curing agent dicyandiamide.

E6.2: 27 g of the monofunctional, light-curable component A, being N-acryloyl morpholine as RD, 63 g of the light-curable component B, being the difunctional aliphatic urethane acrylate Ebecryl 8811 as TNM, and 10 g of the heat-curable component C, being an oligomer of 1,3-bis (citraconimidomethyl)benzene (OBCI) as TGE, were homogenized together with 1 g (1 phr) of the photoinitiator ethyl (2,4,6-trimethylbenzoyl) phenyl phosphinate (TPO-L) and 0.5 g (0.5 phr) of the thermal initiator dicumyl peroxide (DCP).

E6.3: 27 g of the monofunctional, light-curable component A, being N-acryloyl morpholine as RD, 63 g of the light-curable component B, being the difunctional aliphatic urethane acrylate Ebecryl 8811 as TNM, and 10 g of the heat-curable component C, being 4,4'-bismaleimidodiphenylmethane (BMIDPM) as TGE, were homogenized together with 1 g (1 phr) of the photoinitiator ethyl (2,4,6-trimethylbenzoyl) phenyl phosphinate (TPO-L), 0.5 g (0.5 phr) of the thermal initiator dicumyl peroxide (DCP) and 0.2 g (2 phr with respect to the weight content of BMIDPM) of the thermal catalyst 2-ethy-4-methyl imidazole.

TABLE 6

Results for comparative examples 6.1-6.3 (CE6.1-6.3) and examples (6.1-6.3).

| Property | CE6.1 | E6.1 | CE6.2 | CE6.3 | E6.2 | E6.3 |
|---|---|---|---|---|---|---|
| Viscosity of formulation (Pa s) at 30/45/60° C. | 9.10 2.77 0.98 | 8.27 2.75 0.97 | 12.80 3.91 1.32 | 9.38 2.92 1.05 | 13.42 4.68 1.61 | 13.09 4.03 1.40 |
| Tensile modulus (MPa) | 1460 (±50) | 1090 (±50) | 1500 (±50) | 1180 (±50) | 1480 (±100) | 1580 (±100) |
| Tensile strength (MPa) | 40 (±1) | 29 (±1) | 41 (±1) | 34 (±1) | 38 (±1) | 47 (±2) |
| Elongation at break (%) | 28 (±6) | 60 (±2) | 30 (±6) | 38 (±3) | 35 (±7) | 22 (±3) |
| $T_{1\ GPa}$ (° C.) | 50 | 36 | 49 | 39 | 46 | 57 |
| $T_{0.5\ GPa}$ (° C.) | 69 | 51 | 68 | 57 | 63 | 78 |
| $T_g$ (° C.) | 100 | 78 | 97 | 88 | 92 | 108 |

$T_{1\ GPa}$: temperature at which storage modulus G' reaches 1 GPa
$T_{0.5\ GPa}$: temperature at which storage modulus G' reaches 0.5 GPa
$T_g$: glass transition temperature recorded at maximum of tanδ

Discussion

In example 6.1, when formulating the heat-curable component C, being the multifunctional epoxy resin bisphenol A diglycidyl ether (BADGE) as TGE, into a light-curable matrix of components A and B, mechanical performance, in terms of strength and modulus, and also thermal properties, in terms of $T_g$, are slightly decreased by roughly ~5-15%, yet toughness, measured by elongation at break, is dramatically improved (~+50%), when directly compared to comparative example CE6.3, which does not contain a crosslinking component D and is composed solely of light-curable components A and B (Table 6 and FIGS. 8a and 8b). The multifunctional epoxy resin bisphenol A diglycidyl ether (BADGE) in this case is not present in a preferable amount to act as a proper $T_g$-enhancer, yet photopolymer toughness is greatly improved by the resulting dual network structure. With its $T_g$ in the range of ~125-160° C., BADGE also exhibits lower thermal properties compared to the allyl derivatives in examples E1-5. It is however clear to an expert in the field that modifying the BADGE content or adapting curing conditions (e.g., content of thermal curing agent dicyandiamide, additional accelerators such as amines, ureas or imidazoles), would greatly improve the thermal properties of a photopolymer derived from E6.1 or similar formulations.

Comparative example CE6.1 is not an ideal comparison to E6.1 due to its higher functionality of component D, being tris(2-hydroxy ethyl)isocyanurate triacrylate as CA. It is though evident that E6.1 outperforms CE6.1 in this case (see FIG. 8b), as CE6.1 exhibits slight improvements in mechanical and thermal performance (~10-25% overall), yet toughness, measured by elongation at break, is sacrificed to a greater extent (~30%). This again proves a clear advantage for inventive resin formulations disclosed herein.

Examples 6.2 and 6.3 each are composed of TGEs from the class of high temperature thermosets, being citraconimide- and maleimide-based components C. Both examples show a high increase in thermal performance (higher modulus plot over temperature and higher $T_g$ measured by tan δ, see FIG. 8c) compared to the comparative example CE6.3 only comprising components A and B. For E6.2, which comprises the citraconimide-based oligomer OBCI, toughness is almost maintained compared to CE6.3 (<10% loss, see Table 6 and FIG. 8c), yet thermal properties are evidently enhanced (see FIG. 8d). For E6.3, which comprises the bismaleimide-based monomer BMIDPM, thermal properties and mechanical properties are significantly enhanced (~20-40%), due to a high degree of crosslinking and a high amount of rigid aromatic moieties within the final photopolymer network structure (see FIG. 8e) and herein toughness is compromised significantly (~40%), which indicates that in this case the preferable amount of component C has been exceeded and while thermal properties are greatly improved, toughness could not be fully maintained. Yet, elongation at break remains >20%, which is an exceptional value for a photopolymer network with a $T_g$>100° C.

Example 7

Example 7 being an example of the inventive resin composition is composed of light-curable components A, B and D in combination with a heat-curable component C; Comparative Example 7, makes up respective light-curable resin composition comprising components A, B, D and additional monofunctional component A instead of a heat-curable component C.

TABLE 7

Formulation composition for comparative example 7 (CE7) and example 7 (E7)

| Components | CE7 (wt %) | E7 (wt %) |
|---|---|---|
| Monofunctional acrylamide (N-acryloyl morpholine, component A as RD) | 27 | 10 |
| Multifunctional methacrylate (difunctional polyether urethane methacrylate, component B as TNM) | 46 | 46 |
| Multifunctional acrylate (difunctional aliphatic urethane acrylate, component B as TNM) | 16 | 16 |
| Multifunctional methacrylate (isophorone urethane dimethacrylate UDMA-IPDI, component D as CA) | 11 | 11 |
| Multifunctional allyl compound (triallyl isocyanurate, component C as TGE) | — | 17 |

Preparation of Resin Formulations

CE7: 27 g of the monofunctional, light-curable component A, being N-acryloyl morpholine as RD, 46 g of the light-curable component B, being a difunctional polyether urethane methacrylate as TNM, 16 g of the light-curable component B, being a difunctional aliphatic urethane acrylate as TNM, and 11 g of the multifunctional crosslinking component D, being isophorone urethane dimethacrylate as CA, were homogenized together with 1.5 g (1.5 phr) of the photoinitiator phenylbis(2,4,6-trimethylbenzoyl)phosphine oxide (BAPO) and 0.5 g (0.5 phr) of the thermal initiator dicumyl peroxide (DCP).

E7: 10 g of the monofunctional, light-curable component A, being N-acryloyl morpholine as RD, 46 g of the light-curable component B, being a difunctional polyether urethane methacrylate as TNM, 16 g of the light-curable component B, being a difunctional aliphatic urethane acrylate as TNM, 11 g of the multifunctional crosslinking component D, being isophorone urethane dimethacrylate as CA, and 17 g of the heat-curable component C, being triallyl isocyanurate as TGE, were homogenized together with 1.5 g (1.5 phr) of the photoinitiator phenylbis(2,4,6-trimethylbenzoyl)phosphine oxide (BAPO) and 0.5 g (0.5 phr) of the thermal initiator dicumyl peroxide (DCP).

TABLE 8

Results for comparative example 7 (CE7) and example 7 (E7)

| Property | CE7 | E7 |
|---|---|---|
| Tensile modulus (MPa) | 1580 (±100) | 1480 (±50) |
| Tensile strength (MPa) | 41 (±1) | 42 (±1) |
| Elongation at break (%) | 31 (±12) | 21 (±2) |
| HDT(B) (° C.) | 64 | 86 |

HDT(B): HDT measured according to DIN EN ISO 75 method B

Discussion

Example 7 shows that there is high potential in replacing the component A as RD with the heat-curable component C as TGE in order to reach photopolymer materials with improved strength, modulus and high thermal performance (Table 8), yet in this case elongation at break is sacrificed more dramatically as when component C is added to a resin formulation made up from components A and B in other resin examples. Nevertheless, this example shows how the inventive resin toolbox gives great possibility for improving thermal performance and maintaining toughness within the final 3D-parts overall.

Examples 8-23

Examples 8-23 being examples of the inventive resin compositions are composed of multiple light-curable components A, B and optionally D in combination with a heat-curable component C.

TABLE 9

Formulation compositions for examples 8-14 (E8-14)

| Components | E8 (wt %) | E9 (wt %) | E10 (wt %) | E11 (wt %) | E12 (wt %) | E13 (wt %) | E14 (wt %) |
|---|---|---|---|---|---|---|---|
| Monofunctional acrylamide (N-acryloyl morpholine, component A as RD) | 20 | 20 | 20 | 20 | 20 | 27.5 | 27.5 |
| Multifunctional acrylate (difunctional aliphatic urethane acrylate, component B as TNM) | 65 | 32.5 | — | 50 | 35 | 40 | 35 |
| Multifunctional methacrylate (tetrafunctional aliphatic urethane methacrylate, component B as TNM) | — | 32.5 | 65 | — | — | 10 | 10 |

TABLE 9-continued

Formulation compositions for examples 8-14 (E8-14)

| Components | E8 (wt %) | E9 (wt %) | E10 (wt %) | E11 (wt %) | E12 (wt %) | E13 (wt %) | E14 (wt %) |
|---|---|---|---|---|---|---|---|
| Multifunctional methacrylate (difunctional aliphatic urethane methacrylate, component B as TNM) | — | — | — | 15 | 30 | 10 | 15 |
| Multifunctional allyl compound (triallyl isocyanurate, component C as TGE) | 7.5 | 7.5 | 7.5 | 10 | 10 | 7.5 | 7.5 |
| Multifunctional acrylate (tris(2-hydroxy ethyl)isocyanurate triacrylate, component D as CA) | 7.5 | 7.5 | 7.5 | — | — | — | — |
| Multifunctional methacrylate (tricyclodecanedimethanol dimethacrylate, component D as CA) | — | — | — | 5 | 5 | 5 | 5 |

TABLE 10

Formulation compositions for examples 15-23 (E15-23)

| Components | E15 (wt %) | E16 (wt %) | E17 (wt %) | E18 (wt %) | E19 (wt %) | E20 (wt %) | E21 (wt %) | E22 (wt %) | E23 (wt %) |
|---|---|---|---|---|---|---|---|---|---|
| Monofunctional acrylamide (N-acryloyl morpholine, component A as RD) | 25 | 20 | 25 | 20 | 15 | 20 | 20 | 20 | 20 |
| Multifunctional acrylate (difunctional aliphatic acrylate, urethane acrylate, component B as TNM) | 50 | 50 | 70 | 70 | 70 | 65 | 60 | 55 | 50 |
| Multifunctional methacrylate (difunctional aliphatic urethane methacrylate, component B as TNM) | 15 | 15 | — | — | — | — | — | — | — |
| Multifunctional allyl compound (triallyl isocyanurate, component C as TGE) | 5 | 10 | 5 | 10 | 15 | 10 | 10 | 10 | 10 |
| Multifunctional methacrylate (tricyclodecanedimethanol dimethacrylate, component D as CA) | 5 | 5 | — | — | — | — | — | — | — |
| Multifunctional acrylate (tricyclodecanedimethanol diacrylate, component D as CA) | — | — | — | — | — | 5 | 10 | 15 | 20 |

Preparation of Resin Formulations

E8-23: 100 g of the respective resin formulations were prepared by mixing the components from Tables 9-10 in the respective weight ratios. All formulations were homogenized together with 1.5 g (1.5 phr) of the photoinitiator phenylbis(2,4,6-trimethylbenzoyl)phosphine oxide (BAPO) and 0.5 g (0.5 phr) of the thermal initiator dicumyl peroxide (DCP).

TABLE 11

Results for examples 8-14 (E8-14)

| Property | E8 | E9 | E10 | E11 | E12 | E13 | E14 |
|---|---|---|---|---|---|---|---|
| Tensile modulus (MPa) | 1520 (±100) | 2290 (±100) | 2450 (±100) | 1790 (±200) | 1300 (±200) | 1670 (±200) | 1780 (±100) |
| Tensile strength (MPa) | 48 (±1) | 62 (±1) | 65 (±1) | 51 (±1) | 39 (±1) | 47 (±1) | 48 (±1) |

TABLE 11-continued

Results for examples 8-14 (E8-14)

| Property | E8 | E9 | E10 | E11 | E12 | E13 | E14 |
|---|---|---|---|---|---|---|---|
| Elongation at break (%) | 23 (±8) | 14 (±4) | 9 (±1) | 40 (±7) | 45 (±11) | 32 (±5) | 30 (±6) |
| HDT(B) (° C.) | 87 | 97 | 103 | 87 | 72 | 72 | 71 |

HDT(B): HDT measured according to DIN EN ISO 75 method B

TABLE 12

Results for examples 15-23 (E15-23)

| Property | E15 | E16 | E17 | E18 | E19 | E20 | E21 | E22 | E23 |
|---|---|---|---|---|---|---|---|---|---|
| Tensile modulus (MPa) | 1670 (±200) | 1770 (±100) | 2350 (±100) | 2400 (±100) | 2590 (±200) | 1860 (±150) | 1810 (±300) | 1970 (±150) | 2170 (±100) |
| Tensile strength (MPa) | 51 (±1) | 52 (±1) | 66 (±1) | 66 (±1) | 64 (±1) | 48 (±1) | 50 (±1) | 57 (±1) | 59 (±1) |
| Elongation at break (%) | 40 (±7) | 30 (±7) | 36 (±1) | 25 (±5) | 20 (±8) | 32 (±5) | 23 (±7) | 9 (±3) | 12 (±7) |
| HDT(B) (° C.) | 74 | 80 | 89 | 93 | 98 | 79 | 90 | 97 | 105 |

HDT(B): HDT measured according to DIN EN ISO 75 method B

Discussion

Examples 8-23 are inventive resin compositions that have been processed via Hot Lithography and thermal post-processing into materials with high $T_g$ and simultaneously high elongation at break.

The derived results from subjecting the inventive resin compositions to a light-induced structuring step followed by a heat-induced curing step yield materials that exhibit the following material properties:

a tensile modulus of 1300 MPa or more, a tensile strength of 35 MPa or more, an elongation at break of 20% or more, a heat deflection temperature of 70° C. or more (E8, E11-E16, E20-21); or ii) a tensile modulus of 2000 MPa or more, a tensile strength of 55 MPa or more, an elongation at break of 10% or more, a heat deflection temperature of 85° C. or more (E9-10, E17-19, E22-23).

Examples E8-10 show how resin compositions with higher content of components B comprising higher functionality (tetrafunctional in this case) yield materials with higher mechanical and thermal properties, yet reduced elongation at break. Similar effects are observed in examples E11-14 by implementing a component B, being a difunctional aliphatic urethane methacrylate, with lower mechanical and thermal performance compared to the tetrafunctional component B from E8-10.

In examples E15-19 it becomes evident how components A mainly contribute to toughness, being elongation at break, and components C mainly contribute to thermal performance, being $T_g$. Examples E20-23 show the effect of increasing component D, which substitutes component B, resulting in higher (thermo)mechanical performance yet reduced toughness.

These non-limiting examples show how the inventive resin toolbox gives great possibility for improving thermal performance and maintaining toughness within the final 3D-parts overall.

DETAILED DESCRIPTION

Figure 1:
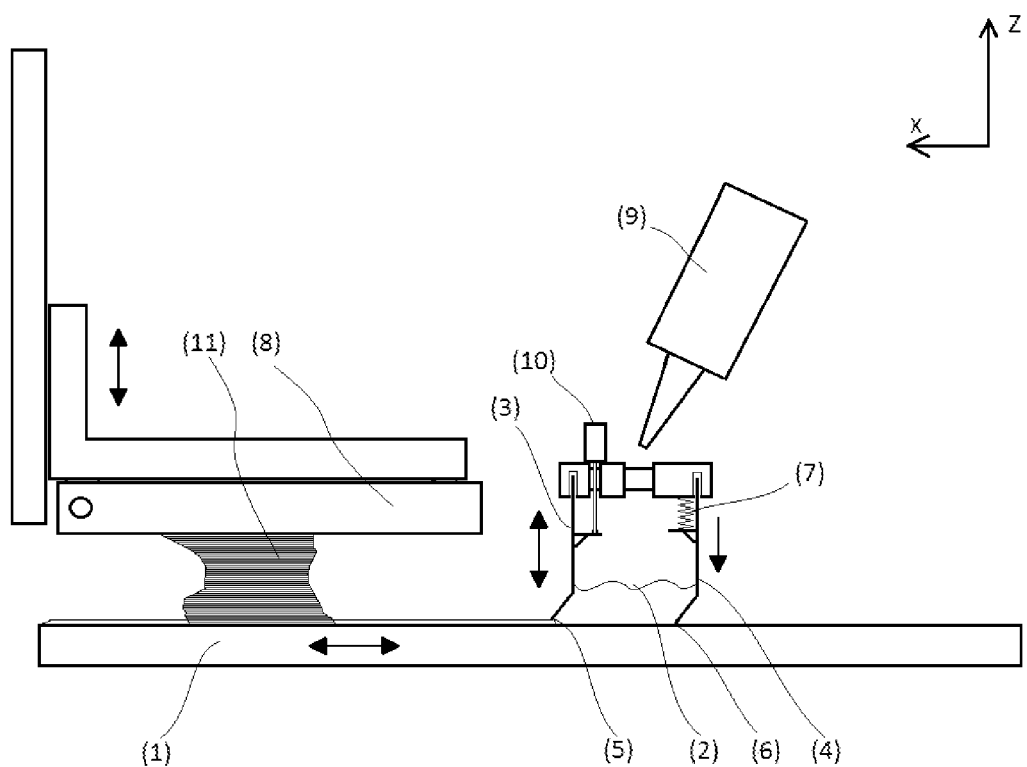
FIG. 1 shows a schematic configuration of a high temperature additive manufacturing device used for light-curing the curable compositions according to the present invention by means of a 3D printing process.
Figure 2:
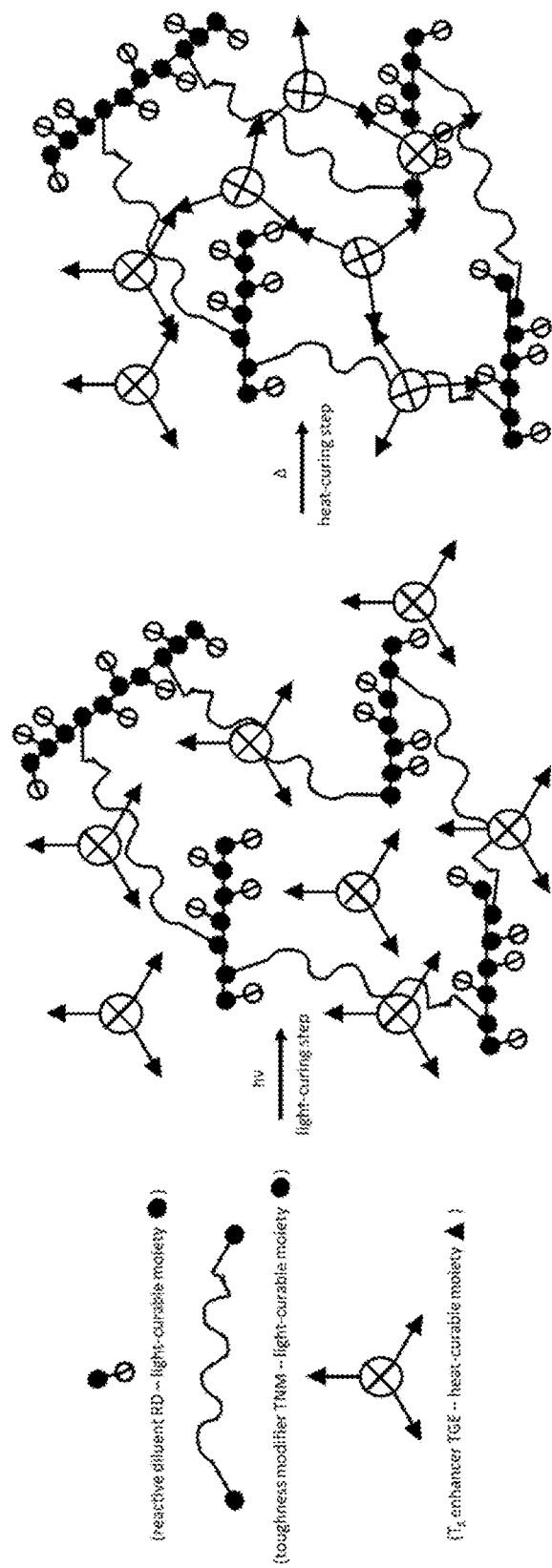
FIG. 2 represents a schematic example for the network formation via a first light-curing step with components A (RD) and B (TNM) and subsequent heat-curing step with component C (TGE)
Figure 3:
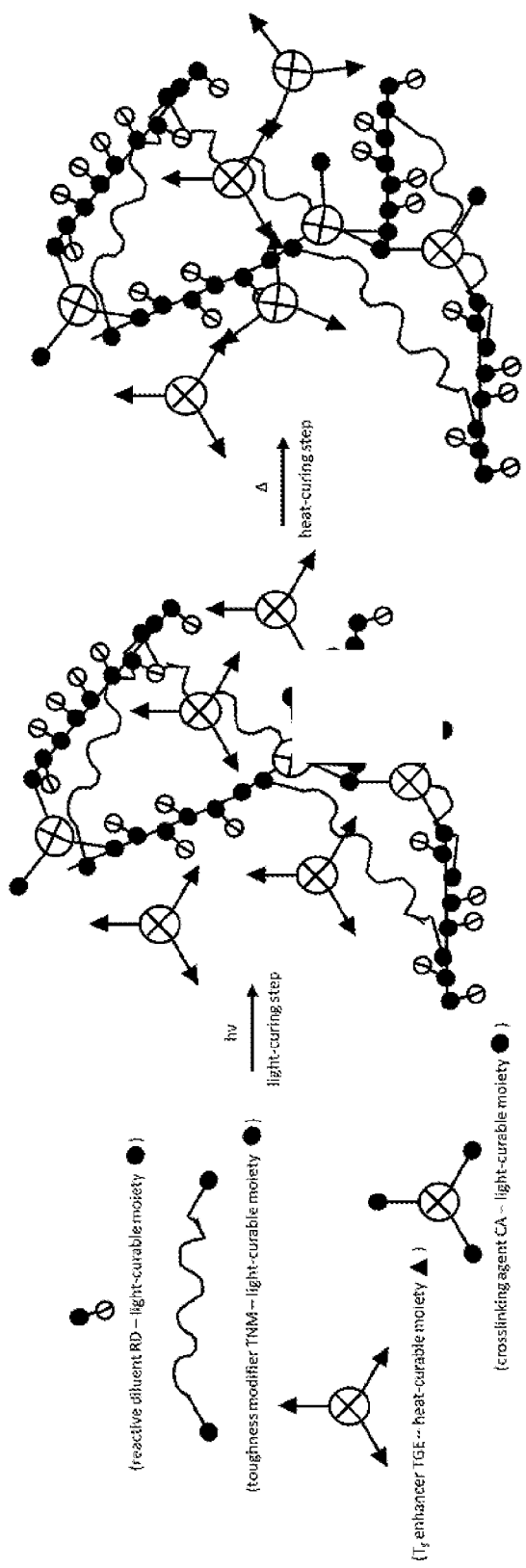
FIG. 3 represents a schematic example for the network formation via a first light curing-step with components A (RD), B (TNM) and D (CA) and subsequent heat-curing step with component C (TGE)
Figure 4:
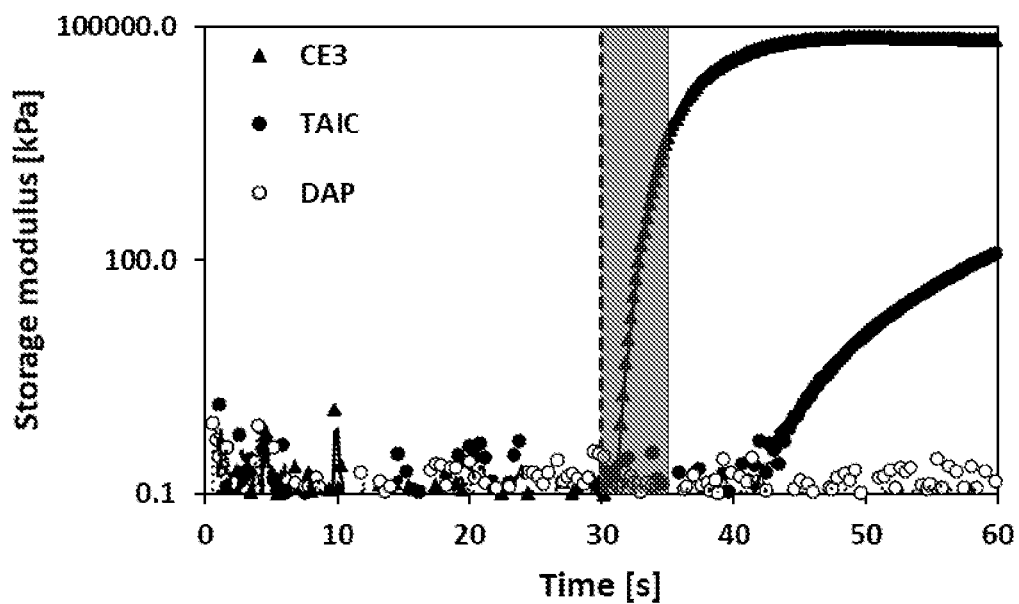
FIG. 4 shows the data retrieved from the photorheology experiments (light-curing step) with comparative example resin CE3 and heat-curable components C (TGEs being TAIC and DAP)
Figure 5:
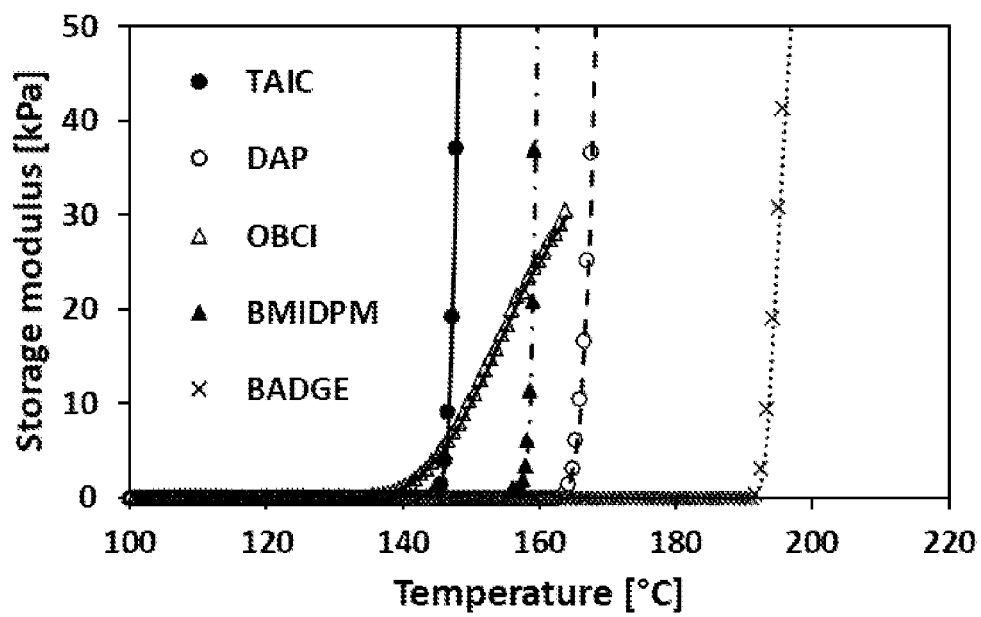
FIG. 5 shows the data retrieved from the thermal rheology experiments (mimicking the heat-curing step) with components C (TGEs being TAIC, DAP, OBCI, BMIDPM and BADGE)
Figure 6A:
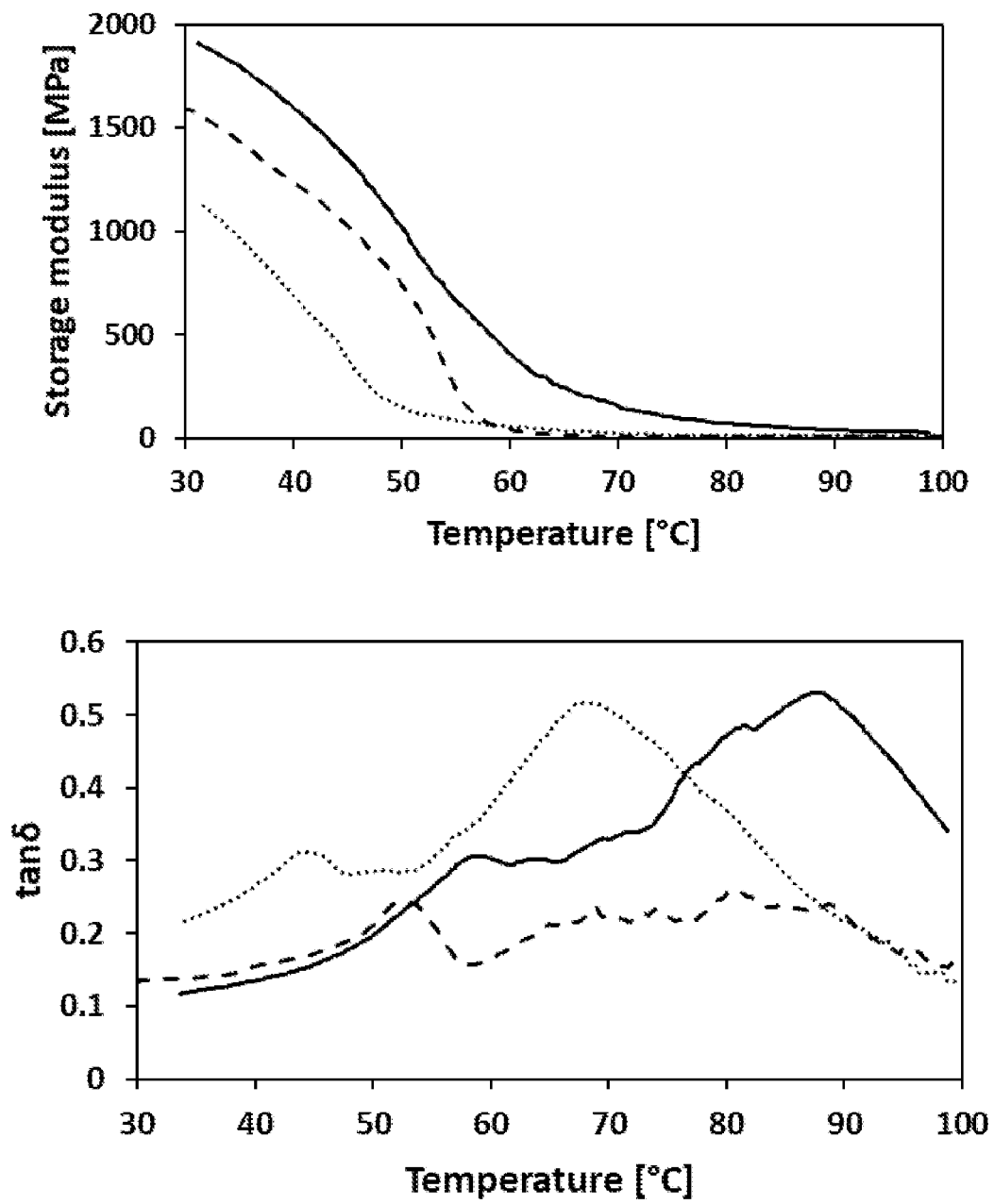
FIG. 6a shows the data retrieved from the DMA of the printed (light-curing step) and post-cured (heat-curing step) photopolymer E1 in comparison to CE1 and CE3 (storage modulus plot— top, tan δ plot—bottom)
Figure 6B:
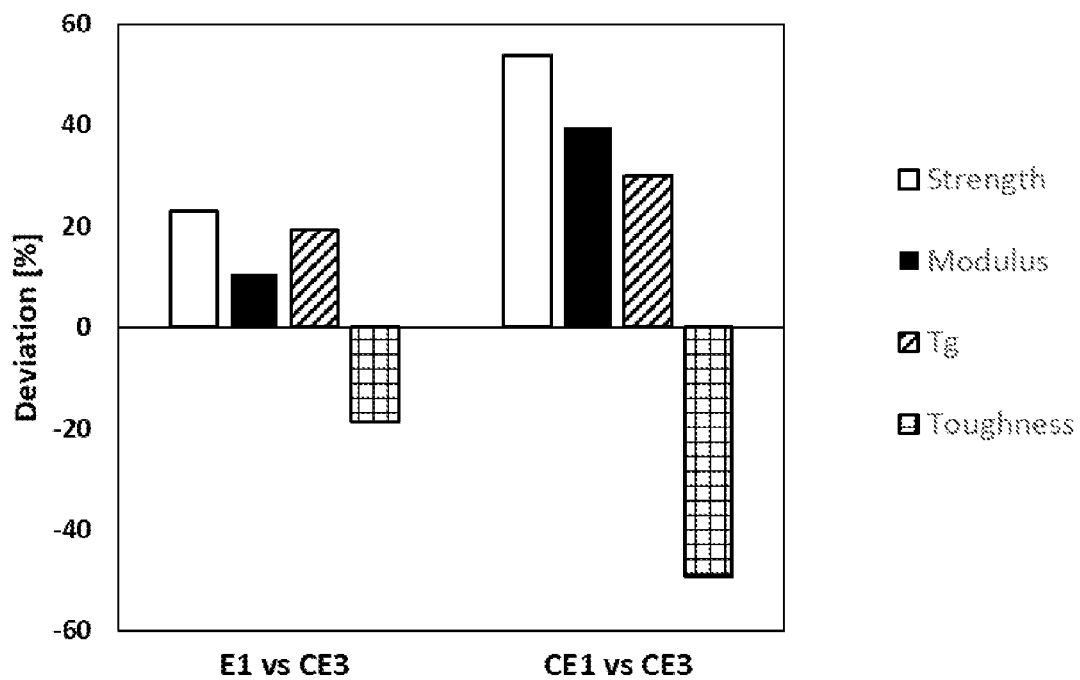
FIG. 6b shows the (thermo)mechanical performance of the printed (light-curing step) and post-cured (heat-curing step) photopolymer E1 in comparison to CE3 and compares CE1 and CE3 with respect to their percentage deviations.
Figure 6C:
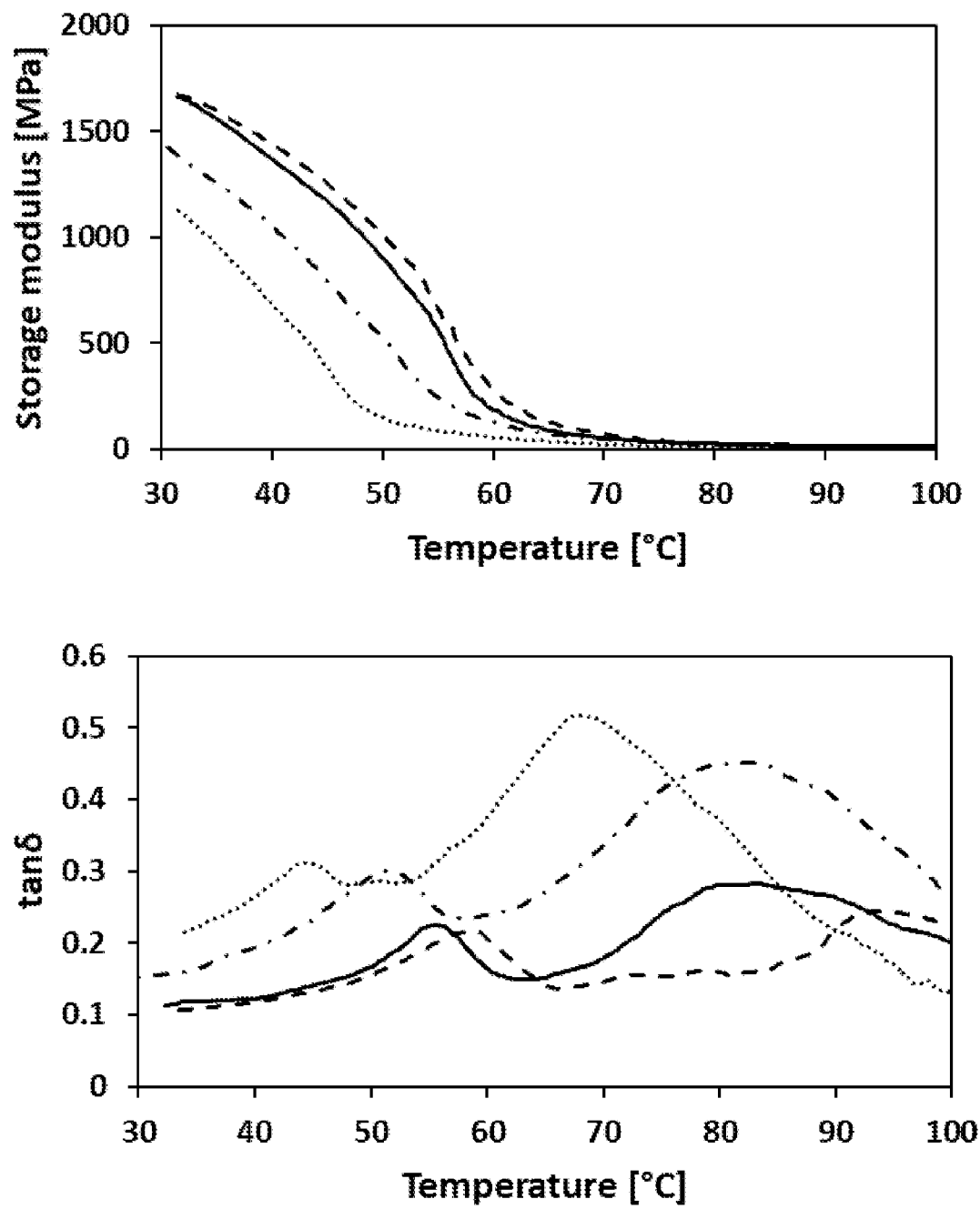
FIG. 6c shows the data retrieved from the DMA of the printed (light-curing step) and post-cured (heat-curing step) photopolymers E2 and E3 in comparison to CE2 and CE3 (storage modulus plot—top, tan δ plot—bottom)
Figure 6D:
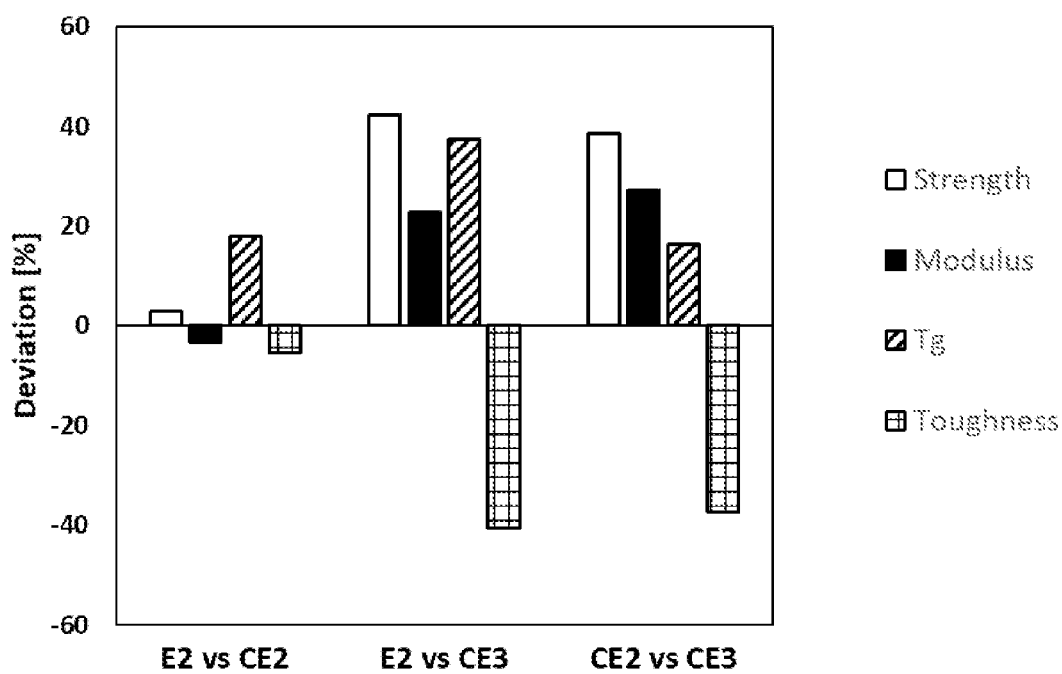
FIG. 6d shows the (thermo)mechanical performance of the printed (light-curing step) and post-cured (heat-curing step) photopolymer E2 in comparison to CE2 and CE3 and compares CE2 and CE3 with respect to their percentage deviations.
Figure 7A:
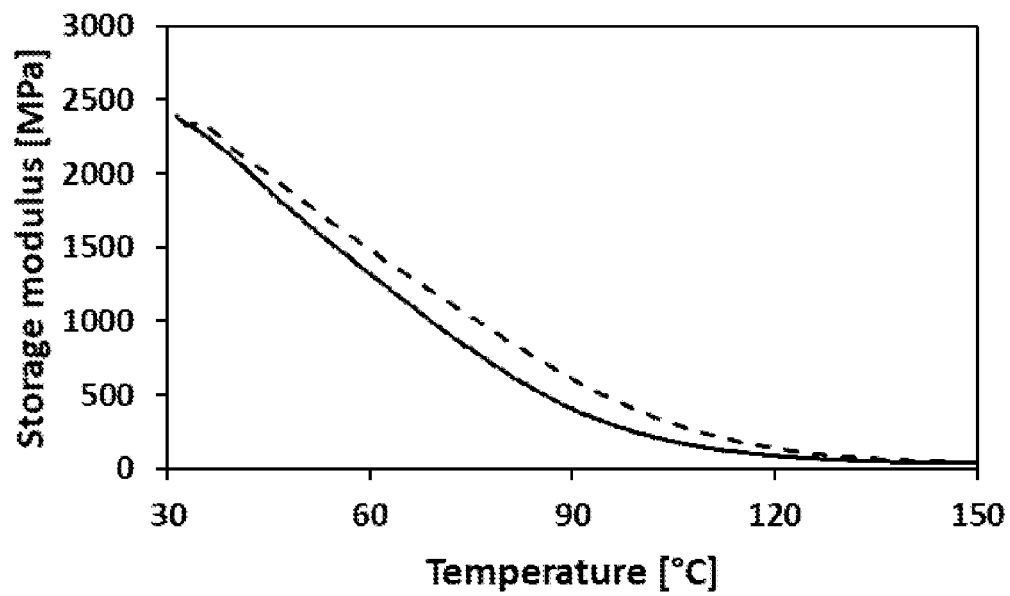
FIG. 7a shows the data retrieved from the DMA of the printed (light-curing step) and post-cured (heat-curing step) photopolymer E4 in comparison to CE4 (storage modulus plot—top, tan δ plot—bottom)
Figure 7A:
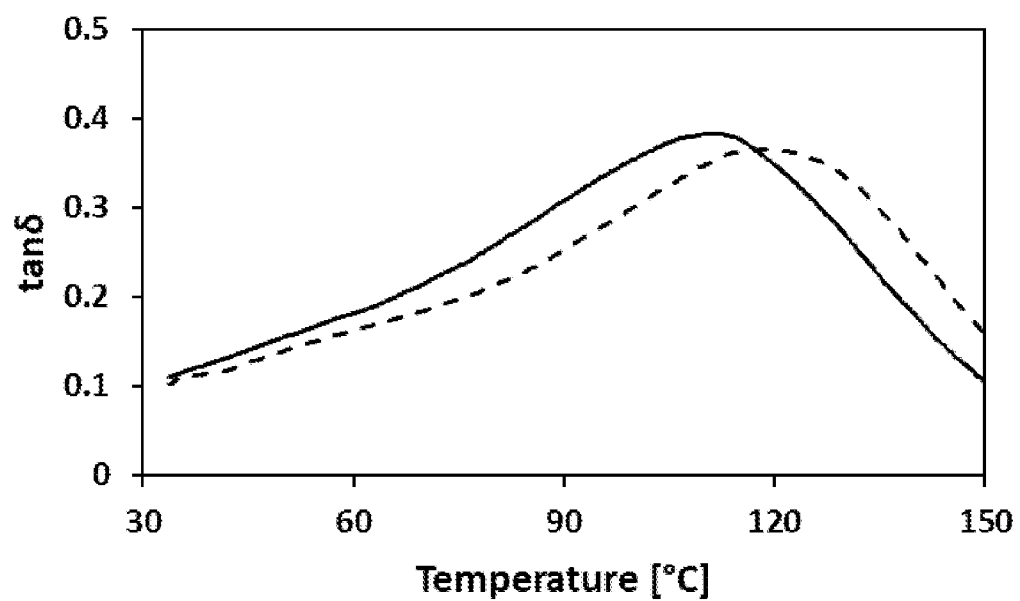
Figure 7B:
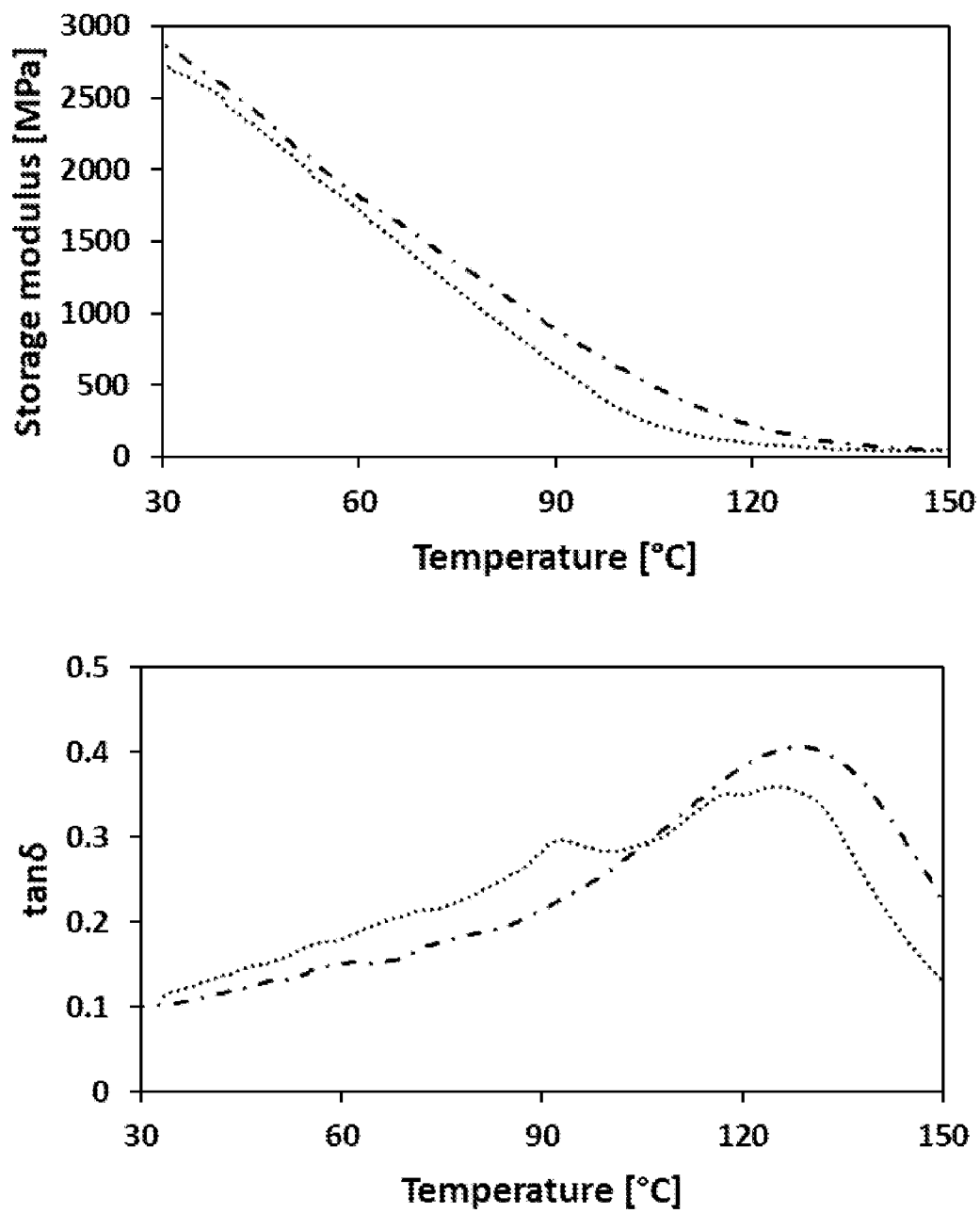
FIG. 7b shows the data retrieved from the DMA of the printed (light-curing step) and post-cured (heat-curing step) photopolymer E5 in comparison to CE5 (storage modulus plot—top, tan δ plot—bottom)
Figure 8A:
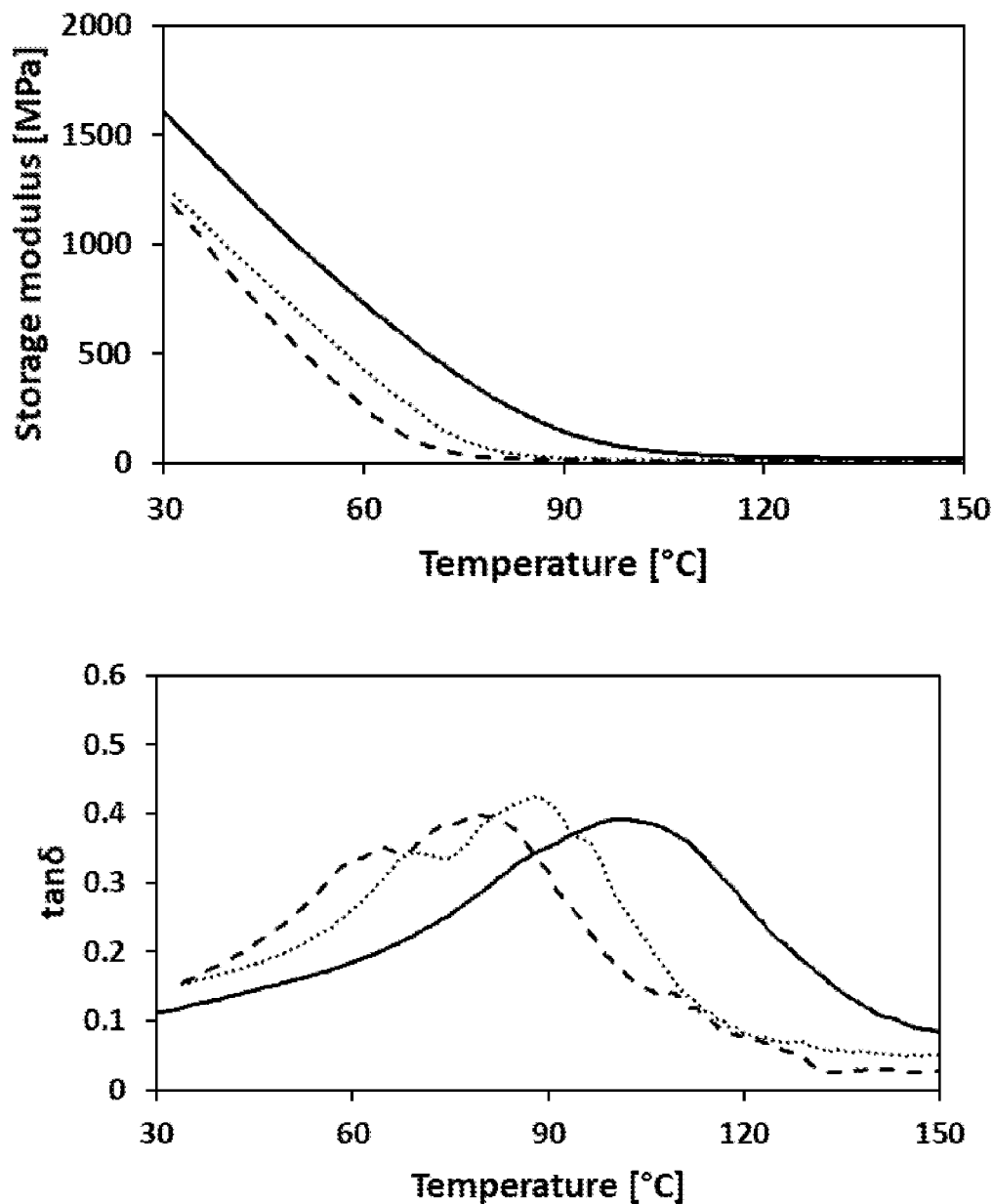
FIG. 8a shows the data retrieved from the DMA of the printed (light-curing step) and post-cured (heat-curing step) photopolymer E6.1 in comparison to CE6.1 and CE6.3 (storage modulus plot—top, tan δ plot—bottom)
Figure 8B:
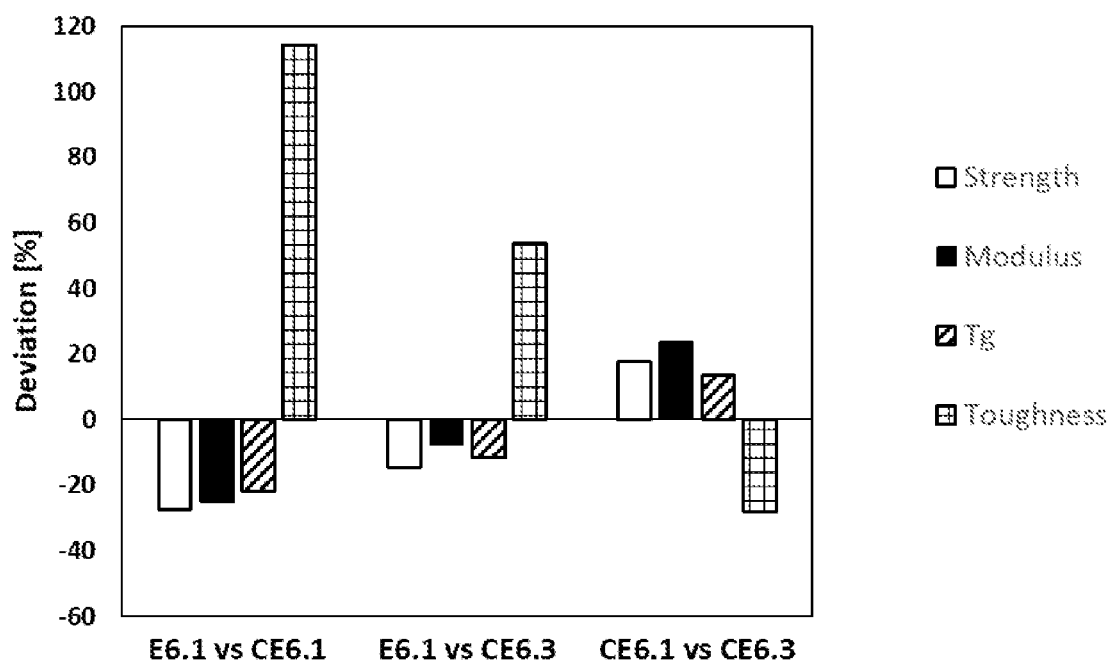
FIG. 8b shows the (thermo)mechanical performance of the printed (light-curing step) and post-cured (heat-curing step) photopolymer E6.1 in comparison to CE6.1 and CE6.3 and compares CE6.1 and CE6.3 with respect to their percentage deviations.
Figure 8C:
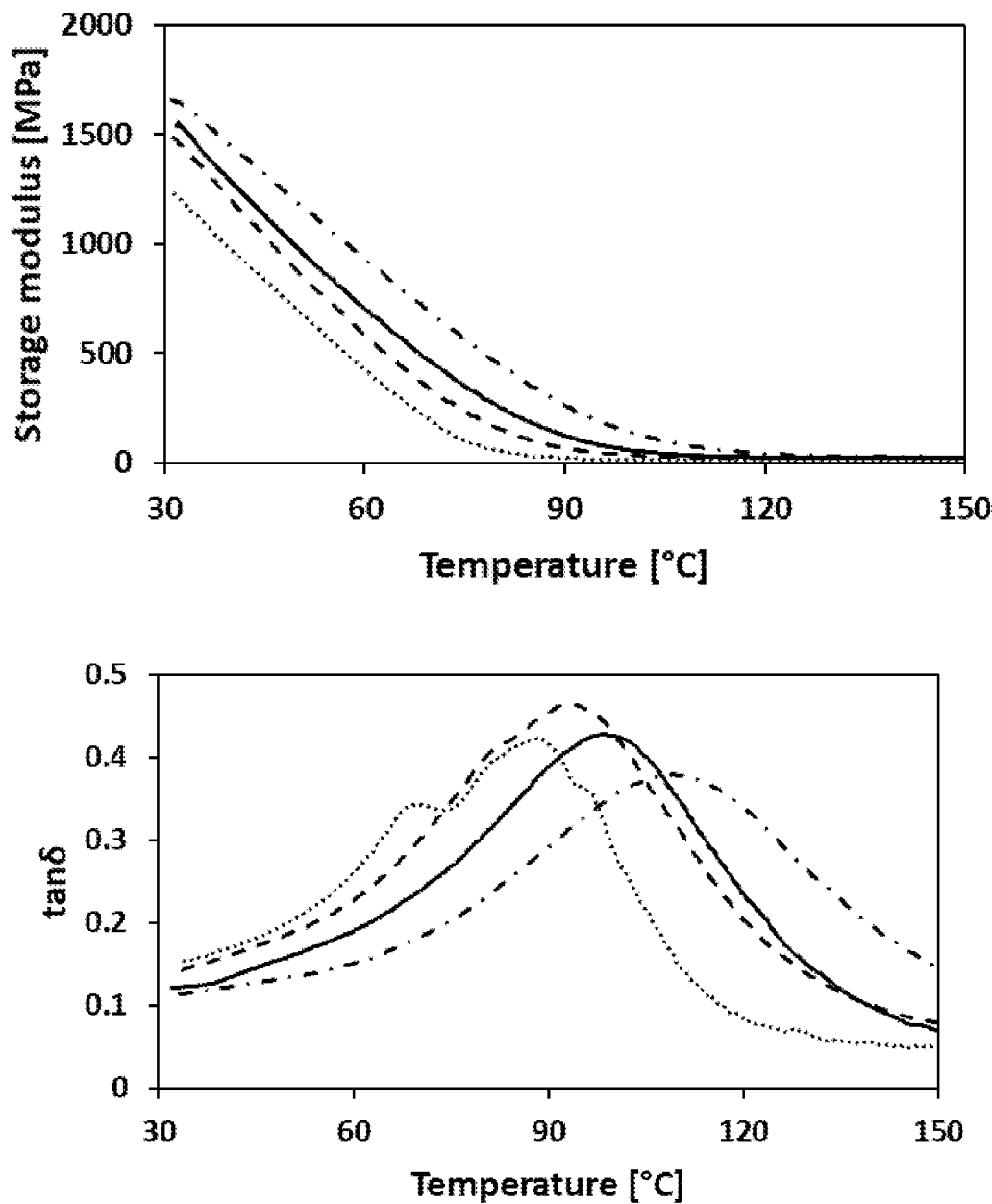
FIG. 8c shows the data retrieved from the DMA of the printed (light-curing step) and post-cured (heat-curing step) photopolymers E6.2 and E6.3 in comparison to CE6.2 and CE6.3 (storage modulus plot—top, tan δ plot—bottom)
Figure 8D:
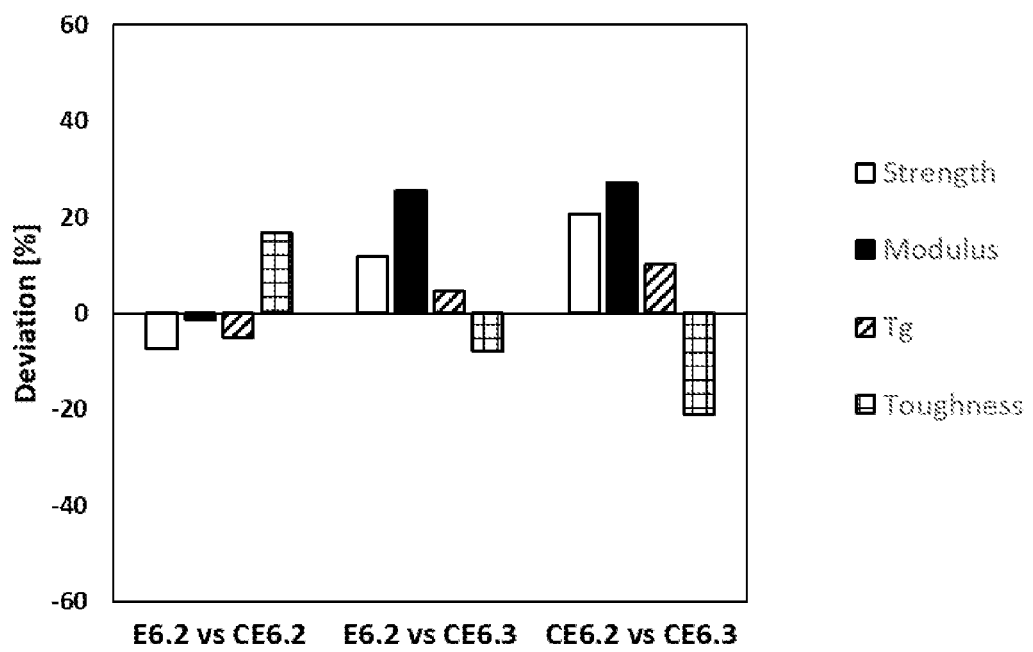
FIG. 8d shows the (thermo)mechanical performance of the printed (light-curing step) and post-cured (heat-curing step) photopolymer E6.2 in comparison to CE6.2 and CE6.3 and compares CE6.2 and CE6.3 with respect to their percentage deviations.
Figure 8E:
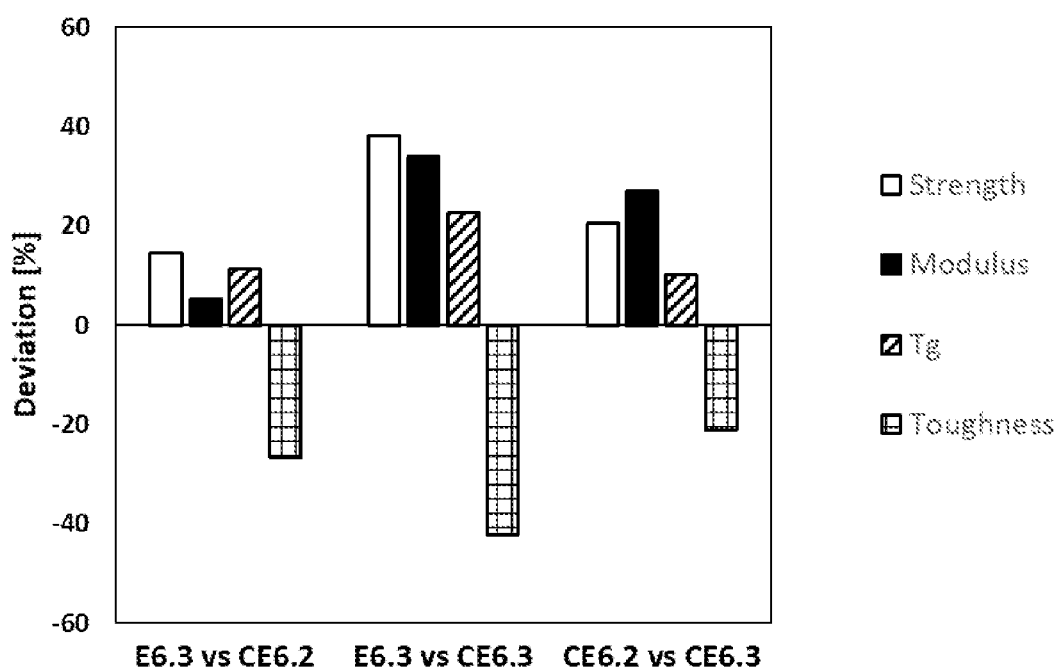
FIG. 8e shows the (thermo)mechanical performance of the printed (light-curing step) and post-cured (heat-curing step) photopolymer E6.3 in comparison to CE6.2 and CE6.3 and compares CE6.2 and CE6.3 with respect to their percentage deviations.

In FIG. 1, reference numeral 1 denotes a material support, on which a material layer 11 is arranged. Spaced from the material support 1, a construction platform 8 is arranged, which is height-adjustable in the z direction and is tiltably mounted about the axis 4. Between the build platform 8 and the material support 1, some material layers 11 are already constructed. The material support 1 is translationally movable along the x-direction perpendicular to the z-direction.

Furthermore, a material introduction device 3 is provided which comprises a first recoater blade 5 and a second re-coater blade 6. The first recoater blade 5 is height adjustable by means of a recoater motor 10 in the z direction and the second recoater blade 6 has a spring 7 which holds the second recoater blade 6 in abutment with the material support 1 in the z direction. Between the two recoater blades 5 and 6 a material reservoir 2 is formed, which can be supplied by means of a conveyor 9 with the inventive resin composition.

In the phase of the method shown in FIG. 1, the material support 1 is in the second position. The construction platform 8 is lowered in the direction of the material support 1, so that a new material layer 11 of the inventive resin composition can be formed by the material layer 11 and is irradiated selectively on the material support 1 by means of a radiation source, not shown, from below through the material support 1 and thereby structured and solidified. The material layer 11 was applied during the movement of the material support 1 in the second position by the first recoater blade 5.

The invention claimed is:

1. A hybrid resin composition for the 3D-printing of objects, the hybrid resin composition comprising components A, B and C for forming cured material constituting an interpenetrating polymer network, a semi-interpenetrating polymer network, a sequential interpenetrating polymer network, or a polymer blend, wherein, a) component A is at least one monofunctional, light-curable component having the formula (I) comprising a reactive species Y that is susceptible of radical polymerization and a side group X, said component A upon light-induced curing forming a polymer backbone of the cured material, $$X-Y \quad \text{Formula (I)}$$

b) component B is at least one mono- or multifunctional, light-curable component, which copolymerizes with component A and has a molecular weight of >500 g mol$^{-1}$, said component B upon the light-induced curing forming a first polymerized network of the cured material with an elongation at break >10% and a $T_g$>0° C., and c) component C comprises a multifunctional, heat-curable component forming a second polymerized network of the cured material serving as a $T_g$-enhancer with a $T_g$>100° C., wherein the amount of the light-curable component A ranges from 5 wt % to 80 wt %, the amount of the light-curable component B ranges from 10 wt % to 90 wt %, and the amount of the heat-curable component C ranges from 1 wt % to 50 wt %, based on the total weight of components A, B, and C; and wherein the component C comprises one or more compound(s) selected from the group consisting of allyl, vinyl, maleimide, citraconimide, benzoxazine, epoxy, phenol, cyanate ester, phthalonitrile, and oligomers or polymers thereof and/or isomers thereof, comprising one or more chemical species chosen from the group consisting of monomers and/or oligomers and/or prepolymers of maleimide and citraconimide derivatives according to formula (II),

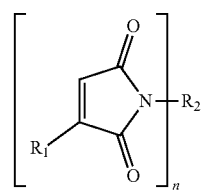

Formula (II)

as well as isomers thereof, wherein
n is an integer between 1 and 10,
R$_1$ represents H, CH$_3$ or CH$_2$,
R$_2$ independently represents a linear, branched, or cyclic C$_5$-C$_{40}$ aliphatic or aromatic residue of one or more of the group consisting of methyl, ethyl, propyl, butyl, pentyl, hexyl, 2-ethylhexyl, octyl, decanyl, dodecanyl, acetic, propanoic, butanoic, pentanoic, undecanoic, dodecanoic, benzoic acid and corresponding esters, alkyl or aromatic esters, cyclopropyl, cyclobutyl, cyclopentyl, cyclohexyl, 4-isobutylcyclohexyl, cycloheptyl, cyclooctyl, adamantyl, isobornyl, salicyl, cholesteryl, phenyl, benzyl, phenethyl, propenyl, biphenyl, naphthyl, anthracenyl, pyrenyl, bis(methylene) oxy, bis(ethylene) oxy, bis (phenyl) methane, bis (phenyl) ethane, bis (phenyl) propane, bis (phenyl) butane, bis (phenyl) ether, bis (phenyl) thioether, bis (phenyl) amino and bis (phenyl) sulfone, where one or more of these groups are optionally, individually linked via an ester, amide, urea, urethane, carbonate, ether, thioether group, which are optionally substituted with one or more $C_1$-$C_6$ alkyl, $C_1$-$C_6$ alkoxy, $C_1$-$C_6$ thioether, halogen, —$NO_2$, —$SO_3H$, —$CF_3$, —OH, —$NH_2$, —SH, —CN, -trimethoxysilyl, -triethoxysilyl or a polymerisable group from the substance classes of maleimide and citraconimide compounds and/or isomers thereof.

2. The hybrid resin composition according to claim 1, wherein:
the amount of light-curable component A ranges from 10 wt % to 60 wt %, based on the total weight of components A, B, and C;
the amount of the light-curable component B ranges from 20 wt % to 80 wt %, based on the total weight of components A, B, and C; and
the amount of the heat-curable component C ranges from 2 wt % to 40 wt %, based on the total weight of components A, B, and C.

3. The hybrid resin composition according to claim 1, wherein:
component B is partly substituted by a crosslinking component D, which is at least one light-curable crosslinking agent (CA) that copolymerizes with components A and B; and
the amount of the crosslinking component D ranges from 3 wt % to 70 wt % based on the total weight of components B and D within the resin composition.

4. The hybrid resin composition according to claim 3, wherein component D comprises one of:
i) multifunctional (meth)acrylates and/or a mixture of multifunctional (meth)acrylates;
ii) aromatic or cycloaliphatic groups; and
iii) tri-, tetra-, penta- and/or hexafunctional (meth)acrylates and/or hyperbranched and/or dendritic (meth)acrylates having functional sites.

5. The hybrid resin composition according to claim 3, wherein component D comprises one or more compounds selected from the group consisting of:
i) 1,4-butanedioldi(meth)acrylate, 1,6-hexanedioldi(meth)acrylate, 1,10-decanedioldi(meth)acrylate, 1,12-dodecanedioldi-(meth)acrylate, tri- or tetraethylenglycol-di(meth)acrylate, pentaerythrittetra (meth)acrylate, and trimethylolpropantri (meth)acrylate, or
ii) 2-(2-biphenyloxy)-ethyl (meth)acrylate, bisphenol-A-di(meth)acrylate, ethoxy- or propoxylated bisphenol-A-di(meth)acrylate, 2,2-bis[4-(2-(meth)acryloxypropoxy) phenyl]propane, tricyclodecanedimethanol di(meth)acrylate, isophorone urethane di(meth)acrylate, and tris (2-hydroxy ethyl) isocyanurate tri (meth)acrylate.

6. The hybrid resin composition according to claim 1, wherein component A comprises one or more compound(s) selected from the group consisting of monofunctional (meth)acrylates, (meth)acrylamides, vinyl ester and N-vinyl compounds respectively selected from the group consisting of isobornyl (meth)acrylate, cyclohexyl (meth)acrylate, trimethyl-cyclohexyl (meth)acrylate, glycerol formal (meth)acrylate, tricyclodecane methanol mono (meth)acrylate, 4-tert-butylcyclohexyl (meth)acrylate, benzyl (meth)acrylate, phenoxyethyl (meth)acrylate, cyclic trimethylolpropane formal (meth)acrylate, 2-(methacryloyloxy) benzoic acid cyclopentyl ester, 2-(methacryloyloxy) benzoic acid cyclohexyl ester, 2-(methacryloyloxy) benzoic acid-2-isopropyl-5-methylcyclohexyl ester, 3-(methacryloyloxy) benzoic acid-2-isopropyl-5-methylcyclohexyl ester, 4-(methacryloyloxy) benzoic acid-2-isopropyl-5-methylcyclohexyl ester, 2-(methacryloyloxy) benzoic acid-3,3,5-trimethylcyclohexyl ester, 2-(acryloyloxy) benzoic acid-3,3,5-trimethylcyclohexyl ester, 2-(methacryloyloxy) benzoic acid decahydronaphthalen-2-yl ester, 2-(methacryloyloxy) benzoic acid-1,3,3-trimethyl-2-bicyclo[2.2.1]heptanyl ester, 2-(methacryloyloxy) benzoic acid-1,7,7-trimethyl-2-bicyclo[2.2.1]heptanyl ester, 2-(methacryloyloxy) benzoic acid-bicyclo[2.2.1]heptan-2-yl methyl ester, 2-(methacryloyloxy) benzoic acid-2-cyclohexylethyl ester, 2-(methacryloyloxy) benzoic acid benzyl ester, 4-(methacryloyloxy) benzoic acid benzoate, 3-(methacryloyloxy) benzoic acid-4-isopropylbenzyl ester, 2-(acryloyloxy) benzoic acid benzyl ester, 2-(methacryloyloxy) benzoic acid phenethyl ester, 4-(methacryloyloxy)-3-methoxybenzoic acid-3-methoxybenzyl ester, 2-(methacryloyloxy) benzoic acid-1-phenylethyl ester, 4-((methacryloyloxy) methyl) benzoic acid cycloheptyl ester, 2-(methacryloyloxy) benzoic acid cyclohexyl methyl ester, cholesteryl (meth)acrylate, biphenyl (meth)acrylate, phenyl acrylamide, diacetone acrylamide, t-butyl acrylamide, N-acryloyl morpholine, N-vinyl pyrrolidone, N-vinyl caprolactam, N-vinyl formamide, vinyl cinnamate, vinyl methyl oxazolidinone, and 2-(allyloxymethyl) acrylic acid methyl ester.

7. The hybrid resin composition according to claim 1, wherein component B comprises multifunctional (meth)acrylates selected from the group consisting of ethoxylated bisphenol A di(meth)acrylates, aliphatic urethane di(meth)acrylates, polyether urethane (meth)acrylates, hydrophobic urethane (meth)acrylates, polyester urethane (meth)acrylates, polyester di(meth)acrylates, modified epoxy di(meth)acrylates, and oligomeric polycarbonate di(meth)acrylates.

8. The hybrid resin composition according to claim 1, wherein component C comprises multifunctional allyl compounds comprising rigid substituents responsible for the formation of polymer backbones or polymer networks providing said $T_g$, selected from the group consisting of aromatic and/or cycloaliphatic and/or heterocyclic groups and/or groups exhibiting strong intermolecular forces and/or a high functionality >2 with respect to reactive groups, respectively selected from the group consisting of 1,3,5-triallyl-1,3,5-triazine-2,4,6 (1H,3H,5H)-trione, 2,4,6-triallyloxy-1,3,5-triazine, triallyl borate, triallyl 1,3,5-benzenetricarboxylate, triallyl citrate, triallyl phosphate, tetraallyl pyromellitate, tetraallyloxyethane, diallyl propyl isocyanurate, diallyl isocyanurate, diallyl phthalate, 2,2-bis (4-allyloxy-3,5-dibromophenyl) propane, diallyl dicarbonate, diallyl carbonate, diallyl 1,4-cyclohexanedicarboxylate, 2,2-diallyl bisphenol A diacetate ether, diallyl terephthalate, diallyl isophthalate, diethyl diallylmalonate, 1,3-diallylurea, 1,3-diallyl-2-thiourea, 2,4-diamino-6-diallylamino-1,3,5-triazine, diallyl oxalate, diallyl malonate, diallyl tetrabromophthalate, 2,6-dially-meta-cresol, N,N-diallylaniline, diallyl cyanamide, N,N-diallylmelamine, 2,2'-diallylbisphenol A, N,N'-diallylpiperazine, 2,2-diallylpyrrolidine, diallyl-carbamic acid tert-butyl ester, diallyl ether bisphenol A, diallyl phenylphosphonate, 5,5'-diallyl-[1,1'-biphenyl]-2,2'-diol, cyclohexanone diallyl acetal, 4,4'-diallyl-1,1'-biphenyl, and 2,2-diallyl-4,4-biphenol.

9. The hybrid resin composition according to claim 1, wherein component C comprises multifunctional epoxy compounds comprising rigid substituents responsible for the formation of polymer backbones or polymer networks providing said $T_g$, selected from the group consisting of aromatic and/or cycloaliphatic and/or heterocyclic groups, and/or groups exhibiting strong intermolecular forces and/or a high functionality >2 with respect to reactive groups, respectively selected from the group consisting of bisphenol A, bisphenol F and bisphenol S derivatives as including bisphenol A diglycidyl ether, bisphenol F diglycidyl ether, bisphenol S diglycidyl ether, and diglycidyl 1,2-cyclohexanedicarboxylate, 4,4'-methylenebis (N,N-diglycidylaniline), trimethylolpropane triglycidyl ether, (3',4'-epoxycyclohexane) methyl-3,4-epoxycyclohexylcarboxylate, condensation products of 1-2-epoxy-4 (2-oxiranyl)-cyclohexane and 2,2-bis(hydroxy methyl) 1-butanol, bisphenol A novolac epoxy resins and oligomers and prepolymers of these derivatives.

10. The hybrid resin composition according to claim 1, further comprising at least one of a comonomer, cooligomer, and coprepolymer, which is able to copolymerize with component C as well as with derivatives thereof.

11. The hybrid resin composition according to claim 1, wherein the resin composition comprises at least one photoinitiator suitable for radical polymerization upon light excitation.

12. The hybrid resin composition according to claim 1, wherein the resin composition comprises at least one thermal initiator and/or catalyst for the thermal curing of component C.

13. The hybrid resin composition according to claim 1, wherein the resin composition comprises one or more initiators for radical polymerization.

14. The hybrid resin composition according to claim 1, wherein the composition comprises toughness modifiers, said toughness modifiers being terminated or functionalized with one or multiple reactive groups susceptible of radical or ionic polymerization.

15. The hybrid resin composition according to claim 1, wherein the resin composition comprises at least one component chosen from polymerization initiators, polymerization inhibitors, solvents, fillers, antioxidants, pigments, dyes, surface modifiers, and core-shell particles.

16. The hybrid resin composition according to claim 1, wherein the resin composition comprises photoinitiators, thermal initiators, catalysts, curing agents, polymerization initiators, polymerization inhibitors, solvents, fillers, antioxidants, pigments, dyes, surface modifiers, core-shell particles, and/or mixtures thereof that are of polymeric nature and/or functionalized with a polymerizable functional group, which can undergo polymerization with components A, B, and/or C.

17. The hybrid resin composition according to claim 1, wherein the resin composition at room temperature has a viscosity >2 Pa s.

18. The hybrid resin composition according to claim 1, wherein the resin composition further comprises mineral flame retardants selected from the group consisting of aluminum hydroxide, magnesium hydroxide, calcium hydroxide, antimony oxide, tin oxide, borax and/or zinc borate, red phosphorous, expanded graphite, and/or organic additives selected from nitrogen donors and/or phosphorous containing substances respectively selected from ammonium polyphosphate, melamine polyphosphate, organic phosphates, triphenyl phosphine, phosphinates, and 9,10-dihydro-9-oxa-10-phosphaphenanthren-10-oxide, or halogenated organic flame retardants as selected from halogenated phosphates, halogenated diphenylether, halogenated styrene, halogenated epoxides, halogenated (meth)acrylates and/or halogenated paraffins, in amounts of 0.5 wt % to 50 wt %, based on the total weight of components A, B, and C, wherein the organic additives are functionalized with a polymerizable group.

19. The hybrid resin composition according to claim 1, wherein said backbone has a $T_g$>25° C.

20. A method of manufacturing an object by 3D-printing, wherein a resin composition according to claim 1 is subjected to a light-induced structuring step followed by a heat-induced curing step.

21. The method according to claim 20, wherein the light-induced structuring step is carried out at a processing temperature of between 30° C. and 150° C.

22. The method according to claim 20, wherein the light-induced structuring step is carried out utilizing an NIR- or UV/Vis light source and corresponding optics, wherein the NIR-configuration is selected to enable 3D-fabrication via two photon photopolymerization, and the UV/Vis configuration is selected from the group consisting of laser/DLP, LED/DLP, laser/LCD, and LED/LCD.

23. The method according to claim 20, wherein the light-induced structuring step comprises building the object on a construction platform layer-by-layer to obtain a stack of structured layers, wherein each of the structured layers is obtained by the steps of:
forming an unstructured layer of predetermined thickness of the resin composition, and
selectively projecting light onto the unstructured layer according to a desired pattern.

24. The method according to claim 23, wherein the unstructured layer of the resin composition has a viscosity at said processing temperature of 0.01 to 70 Pa s.

25. The method according to claim 20, wherein the heat-induced curing step is performed at a temperature that is higher than a processing temperature of the light-induced structuring step.

26. The method according to claim 20, wherein the heat-induced curing step comprises at least one of:
heating in an oven;
subjecting to electromagnetic radiation; and
inducing secondary exothermic reactions.

27. An object manufactured from a resin composition by a method according to claim 20.

28. The object according to claim 27, wherein the object comprises an interpenetrating polymer network.

29. The object according to claim 27, wherein the object exhibits:
i) a tensile modulus of 800 MPa or more, a tensile strength of 25 MPa or more, an elongation at break of 20% or more, a glass transition temperature of 45° C. or more, and a temperature value at 1 GPa storage modulus of 30° C. or more;
ii) a tensile modulus of 1500 MPa or more, a tensile strength of 35 MPa or more, an elongation at break of 5% or more, a glass transition temperature of 90° C. or more, and a temperature value at 1 GPa storage modulus of 45° C. or more;
iii) a tensile modulus of 2000 MPa or more, a tensile strength of 50 MPa or more, an elongation at break of 5% or more, a glass transition temperature of 100° C. or more, and a temperature value at 1 GPa storage modulus of 60° C. or more;
iv) a tensile modulus of 1300 MPa or more, a tensile strength of 35 MPa or more, an elongation at break of 20% or more, and a heat deflection temperature of 70° C. or more; or
v) a tensile modulus of 2000 MPa or more, a tensile strength of 55 MPa or more, an elongation at break of 10% or more, and a heat deflection temperature of 85° C. or more.

* * * * *